(12) United States Patent
Zheng et al.

(10) Patent No.: US 8,268,195 B2
(45) Date of Patent: Sep. 18, 2012

(54) ELECTRICALLY CONDUCTIVE FILMS FORMED FROM DISPERSIONS COMPRISING POLYTHIOPHENES AND ETHER CONTAINING POLYMERS

(75) Inventors: Shiying Zheng, Center Valley, PA (US);
Steffen Zahn, Pennsburg, PA (US);
Gang Chris Han-Adebekun, Center Valley, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 309 days.

(21) Appl. No.: 12/388,862

(22) Filed: Feb. 19, 2009

(65) Prior Publication Data
US 2010/0081007 A1 Apr. 1, 2010

Related U.S. Application Data

(60) Provisional application No. 61/100,979, filed on Sep. 29, 2008.

(51) Int. Cl.
*H01B 1/00* (2006.01)
*C08G 75/00* (2006.01)
*C08G 73/00* (2006.01)
*C08G 73/06* (2006.01)

(52) U.S. Cl. ......... 252/500; 528/377; 528/422; 528/423

(58) Field of Classification Search .............. 257/40; 252/500; 528/373, 422, 423
See application file for complete search history.

(56) References Cited

U.S. PATENT DOCUMENTS

| | | | |
|---|---|---|---|
| 3,282,875 A | 11/1966 | Connolly et al. | |
| 4,156,616 A | 5/1979 | Dietz et al. | |
| 4,358,545 A | 11/1982 | Ezzell et al. | |
| 4,433,082 A | 2/1984 | Grot | |
| 4,940,525 A | 7/1990 | Ezzell et al. | |
| 5,279,654 A | 1/1994 | Keirs et al. | |
| 5,300,575 A | 4/1994 | Jonas et al. | |
| 5,324,349 A | 6/1994 | Sano et al. | |
| 5,378,402 A * | 1/1995 | Cross et al. | 252/500 |
| 5,422,411 A | 6/1995 | Wei et al. | |
| 5,578,249 A | 11/1996 | Ohtani et al. | |
| 6,087,196 A | 7/2000 | Sturm et al. | |
| 6,150,426 A | 11/2000 | Curtin et al. | |
| 6,376,105 B1 * | 4/2002 | Jonas et al. | 428/690 |
| 7,105,237 B2 * | 9/2006 | Sotzing | 428/704 |
| 7,196,151 B2 | 3/2007 | Haring | |
| 7,202,001 B2 | 4/2007 | Cao et al. | |
| 7,317,047 B2 * | 1/2008 | Hsu | 524/165 |

(Continued)

FOREIGN PATENT DOCUMENTS
EP 1 647 566 A 4/2006
(Continued)

OTHER PUBLICATIONS

Wu, CC et al; "Integration of Organic LED's and Amorphous Si TFT's onto Flexible and Lightweight Metal foil substrates."; IEEE Electronic Device Letters, vol. 18, No. 12, Dec. 1997; p. 609-612.

(Continued)

*Primary Examiner* — Mark Kopec
*Assistant Examiner* — Jaison Thomas
(74) *Attorney, Agent, or Firm* — Michael K. Boyer

(57) ABSTRACT

An aqueous dispersion and a method for making an aqueous dispersion. The dispersion including at least one conductive polymer such as a polythienothiophene, at least one ether containing polymer and optionally at least one colloid-forming polymeric acid and one non-fluorinated polymeric acid. Devices utilizing layers formed of the inventive dispersions are also disclosed.

18 Claims, 1 Drawing Sheet

U.S. PATENT DOCUMENTS

| | | | |
|---|---|---|---|
| 7,744,777 B2* | 6/2010 | Hsu et al. | 252/500 |
| 2002/0156232 A1* | 10/2002 | Hsu | 528/422 |
| 2004/0121210 A1 | 6/2004 | Hamrock et al. | |
| 2004/0254297 A1* | 12/2004 | Hsu et al. | 525/54.2 |
| 2005/0037265 A1 | 2/2005 | Watakabe | |
| 2005/0154119 A1 | 7/2005 | Robeson et al. | |
| 2006/0076557 A1 | 4/2006 | Waller et al. | |
| 2007/0069184 A1 | 3/2007 | Hsu et al. | |
| 2007/0172702 A1* | 7/2007 | Elschner et al. | 428/690 |
| 2008/0145669 A1* | 6/2008 | Ye et al. | 428/419 |
| 2009/0014693 A1 | 1/2009 | Zahn | |
| 2009/0018348 A1 | 1/2009 | Zahn et al. | |

FOREIGN PATENT DOCUMENTS

| | | |
|---|---|---|
| WO | 03006537 A1 | 1/2003 |
| WO | 2008/006945 A | 1/2008 |

OTHER PUBLICATIONS

Su, Wench Eng et al: "Trilayer Polymer OLED Devices for Passive Matrix Application;" SID 05 Digest, p. 1871-1873.

Periodic Table of the Elements (Handbook of Chemistry and Physics, 81 Edition; (2000).

Fyfe, David: "Advances in P-OLED Technology—Overcoming the Hurdles Fast" OLEDS 2004; San Diego; Nov. 2004.

Zahn, Steffen et al., "Heterocyclic Fused Selenophene Monomers;" U.S. Appl. No. 12/353,609, filed Jan. 14, 2009.

Zahn, Steffen, "Selenium Containing Electrically Conductive Polymers and Method of Making Electrically Conductive Polymers," U.S. Appl. No. 12/353,461, filed Jan. 14, 2009.

Hickner, M.A., et al.; "Alternative Polymer Systems for Proton Exchange Membranes (PEMs)"; Chem. Rev.; vol. 104; 2004; pp. 4587-4612.

Miyatake, K., et al.; "Novel Sulfonated Poly(arylene ether): A Proton Conductive Polymer Electrolyte Designed for Fuel Cells"; Macromolecules; vol. 36; 2003; pp. 9691-9693.

Johnson, B.C., et al.; "Synthesis and Characterization of Sulfonated Poly(arylene Ether Sulfones)"; Journal of Polymer Science: Polymer Chemistry Edition; vol. 22; 1984; pp. 721-737.

* cited by examiner

ELECTRICALLY CONDUCTIVE FILMS FORMED FROM DISPERSIONS COMPRISING POLYTHIOPHENES AND ETHER CONTAINING POLYMERS

This Application claims the benefit of Provisional Application No. 61/100,979, filed on Sep. 29, 2008. The disclosure of that Application is hereby incorporated by reference.

FIELD OF THE INVENTION

The present invention relates to producing electrically conductive films cast from aqueous dispersions comprising electrically conducting polymers. In particular, the present invention is directed to conductive polymer dispersions synthesized in the presence of at least one ether containing polymer and optionally at least one fluorinated, colloid forming polymeric acid and at least one non-fluorinated polymeric acid.

BACKGROUND OF THE INVENTION

Electrically conducting polymers have been used in a variety of organic electronic devices, including in the development of electroluminescent (EL) devices for use in light emissive displays. With respect to EL devices, such as organic light emitting diodes (OLEDs) containing conducting polymers, such devices generally have the following configuration:

anode/hole injection layer/EL layer/cathode

The anode is typically any material that has the ability to inject holes into the otherwise filled π-band of the semiconducting material used in the EL layer, such as, for example, indium/tin oxide (ITO). The anode is optionally supported on a glass or plastic substrate. The EL layer is typically semiconducting, conjugated organic material, including a conjugated semiconducting polymer such as poly(paraphenylenevinylene), polyfluorene, spiropolyfluorene or other EL polymer material, a small molecule fluorescent dye such as 8-hydroxyquinoline aluminum ($Alq_3$), a small molecule phosphorescent dye such as fac tris(2-phenylpyridine) Iridium (III) (doped in a host matrix), a dendrimer, a conjugated polymer grafted with phosphorescent dye, a blend that contains the above-mentioned materials, and combinations. The EL layer can also be inorganic quantum dots or blends of semiconducting organic material with inorganic quantum dots. The cathode is typically any material (such as, e.g., Ca or Ba) that has the ability to inject electrons into the otherwise empty $\pi^*$-band of the semiconducting organic material in the EL layer.

The hole injection layer (HIL) is typically a conducting polymer and facilitates the injection of holes from the anode into the semiconducting organic material in the EL layer. The hole injection layer can also be called a hole transport layer, hole injection/transport layer, or anode buffer layer, or may be characterized as part of a bilayer anode. Typical conducting polymers employed as hole injection layer include polyaniline and polydioxythiophenes such as poly(3,4-ethylenedioxythiophene) (PEDOT). These materials can be prepared by polymerizing aniline or dioxythiophene monomers in aqueous solution in the presence of a water soluble polymeric acid, such as poly(styrenesulfonic acid) (PSSA), as described in, for example, U.S. Pat. No. 5,300,575 entitled "Polythiophene dispersions, their production and their use"; hereby incorporated by reference in its entirety. A well known PEDOT/PSSA material is Baytron®-P, commercially available from H. C. Starck, GmbH (Leverkusen, Germany).

Electrically conducting polymers have also been used in photovoltaic devices, which convert radiation energy into electrical energy. Such devices generally have the following configuration:

positive electrode/hole extraction layer/light harvesting layer(s)/negative electrode The positive electrode and negative electrode can be selected from materials used for the anode and cathode of EL devices mentioned above. The hole extraction layer is typically a conducting polymer that facilitates the extraction of holes from the light harvesting layers for collection at the positive electrode. The light harvesting layer or layers typically consists of organic or inorganic semiconductors that can absorb light radiation and generate separated charges at an interface.

Aqueous electrically conductive polymer dispersions synthesized with water soluble polymeric sulfonic acids have undesirable low pH levels. The low pH can contribute to decreased stress life of an EL device containing such a hole injection layer, and contribute to corrosion within the device. Accordingly, there is a need in this art for compositions and hole injection layer prepared therefrom having improved properties.

Electrically conducting polymers also have utility as electrodes for electronic devices, such as thin film field effect transistors. In such transistors, an organic semiconducting film is present between source and drain electrodes. To be useful for the electrode application, the conducting polymers and the liquids for dispersing or dissolving the conducting polymers have to be compatible with the semiconducting polymers and the solvents for the semiconducting polymers to avoid re-dissolution of either conducting polymers or semiconducting polymers. The electrical conductivity of the electrodes fabricated from the conducting polymers should be greater than $10^{-3}$ S/cm (where S is a reciprocal ohm). However, the electrically conducting polythiophenes made with a polymeric acid typically provide conductivity in the range of about $10^{-3}$ S/cm or lower. In order to enhance conductivity, conductive additives may be added to the polymer. However, the presence of such additives can deleteriously affect the processability of the electrically conducting polythiophene. Accordingly, there is a need in this art for improved conducting polymers with good processability and increased conductivity.

Due to the limited lifetime of double or bilayer devices, more complicated device structures have been introduced to improve the device performance, especially lifetime. For example, a thin layer of a hole transporting and electron blocking material, which is known as an "interlayer", has been shown to be effective in improving device performance and lifetime. Cambridge Display Technology reported enhanced lifetime with interlayer at OLEDs 2004 conference [David Fyfe, "Advances in P-OLED Technology—Overcoming the Hurdles Fast", OLEDs 2004, San Diego, Calif. from Nov. 15 to 17, 2004; hereby incorporated by reference in its entirety]. So et al. reported 2× enhancement in efficiency and 7× enhancement in lifetime by inserting a crosslinkable hole transporting layer (XL-HTL) between the PEDOT:PSSA hole injection layer and a green polyfluorene light emitting layer. [Wencheng Su, Dmitry Poplavskyy, Franky So, Howard Clearfield, Dean Welsh, and Weishi Wu, "Trilayer Polymer OLED Devices for Passive Matrix Applications", SID 05 Digest, Page 1871-1873; hereby incorporated by reference in its entirety].

Therefore what is needed is a process for fabrication of electrically conductive polymers and electrically conductive polymers produced having improved dispersability.

BRIEF SUMMARY OF THE INVENTION

The present invention solves problems associated with conventional dispersions by providing aqueous dispersions comprising at least one conductive polymer such as polyaniline, polypyrroles or polythiophene (e.g., poly(thieno[3,4-b]thiophene) (PTT), PEDOT, mixtures thereof, among others) and their derivatives or combinations thereof, at least one ether containing polymer and optionally at least one colloid-forming fluorinated polymeric acid. Without wishing to be bound by any theory or explanation, it is believed that the ether containing polymer can function as a dispersant. It was a surprising discovery that adding a relatively small amount of at least one ether containing polymer to the dispersion can significantly improve the properties of films cast from the resultant dispersion comprising at least one conductive polymer. The inventive compositions are useful as a hole injection layer in a variety of organic electronic devices, such as, for example, organic light emitting diodes (OLEDs), as hole extraction layer in a variety of organic optoelectronic devices, such as, for example, organic photovoltaic devices (OPVDs), and as the charge injection layer between the source/drain electrodes and the semiconductive channel material, among other applications.

In accordance with one embodiment, the present invention relates to organic electronic devices, including electroluminescent devices, comprising a hole injection layer of the inventive compositions. The layers formed with a conductive polymer (e.g., polythienothiophene) dispersion according to embodiments of the present invention include resistivity stability during annealing process. In addition, the present invention permits fabricating bi-layered devices having acceptable lifetime performance. By "lifetime" it is meant the length of time taken for an initial brightness of a continuously operating device (e.g., a PLED) to decrease to a ratio of the initial brightness that is acceptable for the targeted application (e.g., 50% of the initial brightness).

In accordance with another embodiment, the present invention relates to a method for synthesizing aqueous dispersions comprising, for example, polythienothiophenes and at least one ether containing polymer and optionally at least one fluorinated colloid-forming polymeric acid. The method for producing an aqueous dispersion comprising at least one conductive polymer, and at least one ether containing polymer, comprises the following:
(a) providing an aqueous solution comprising at least one oxidant and/or at least one catalyst;
(b) providing an aqueous dispersion comprising an appropriate amount of the ether containing polymer;
(c) combining the aqueous solution of the oxidant and/or catalyst with the aqueous dispersion of the ether containing polymer;
(d) adding a monomer or a precursor of the conductive polymer to the combined aqueous dispersion of step (c);
(e) polymerizating the monomer or precursor containing dispersion to form a polymeric dispersion;
(f) contacting the polymeric dispersions with ion exchange resin(s) to remove impurities; and
(g) if desired, adjusting the pH of the polymer dispersion to a pH sufficiently high to provide even more stable resistivity.

Alternatively, the method for producing an aqueous dispersion comprising at least one conductive polymer, and at least one ether containing polymer, comprises the following:
(a) providing an aqueous solution comprising at least one oxidant and/or at least one catalyst;
(b) providing an aqueous dispersion comprising an appropriate amount of the ether containing polymer;
(c) adding the aqueous dispersion of ether containing polymer of step (b) to a monomer or a precursor of the conductive polymer;
(d) adding the oxidant and/or catalyst solution of step (a) to the combined mixture of step (c);
(e) polymerizating the monomer or precursor containing dispersion to form a conductive polymeric dispersion;
(f) contacting the polymeric dispersions with ion exchange resin(s) to remove impurities; and
(g) if desired, adjusting the pH of the polymer dispersion to a pH sufficiently high to provide even more desirable properties.

In a further embodiment, a film forming additive such as at least one member selected from the group consisting of organic solvents, surfactants, among others can be added to the dispersions to improve coating or printing properties of the conductive polymer dispersions. While any suitable film forming additive(s) can be employed, examples of such additives comprise at least one member selected from the group consisting of organic solvents such as ethylene glycol, propylene glycol, propylene glycol propyl ether, methyl ether ketone. The amount of film forming additives can comprise about 5 to about 70 wt. % of the dispersion.

In another further embodiment, counter ions such as Na+, K+, NH4+, Cs+, Mg2+, Li+, Ca2+ can be added to the dispersion, for example, in order to modify the dispersion and film properties such as pH level, ion content, doping level, work functions, among other benefits. While any suitable source of the counter ions can be employed, examples of suitable sources can comprise at least one member selected from the group consisting of Na+ and NH4+. The amount of the counter ion source can comprise about 0.05 to about 5 wt. % of the dispersion.

In another embodiment, additives such as ionic compounds can be added to the dispersion, for example, in order to modify the dispersion and film properties such as pH level, ion content, doping level, work functions, among other benefits. Examples of suitable sources can comprise at least one member selected from the group consisting guanidine sulfate, ammonium sulfate, and sodium sulfate.

The inventive dispersions can be applied onto any suitable substrate, and dried. If desired, the coated substrate can be heated under conditions sufficient to impart a desired conductivity, device performance and lifetime performance.

DETAILED DESCRIPTION OF THE INVENTION

Figure 1:
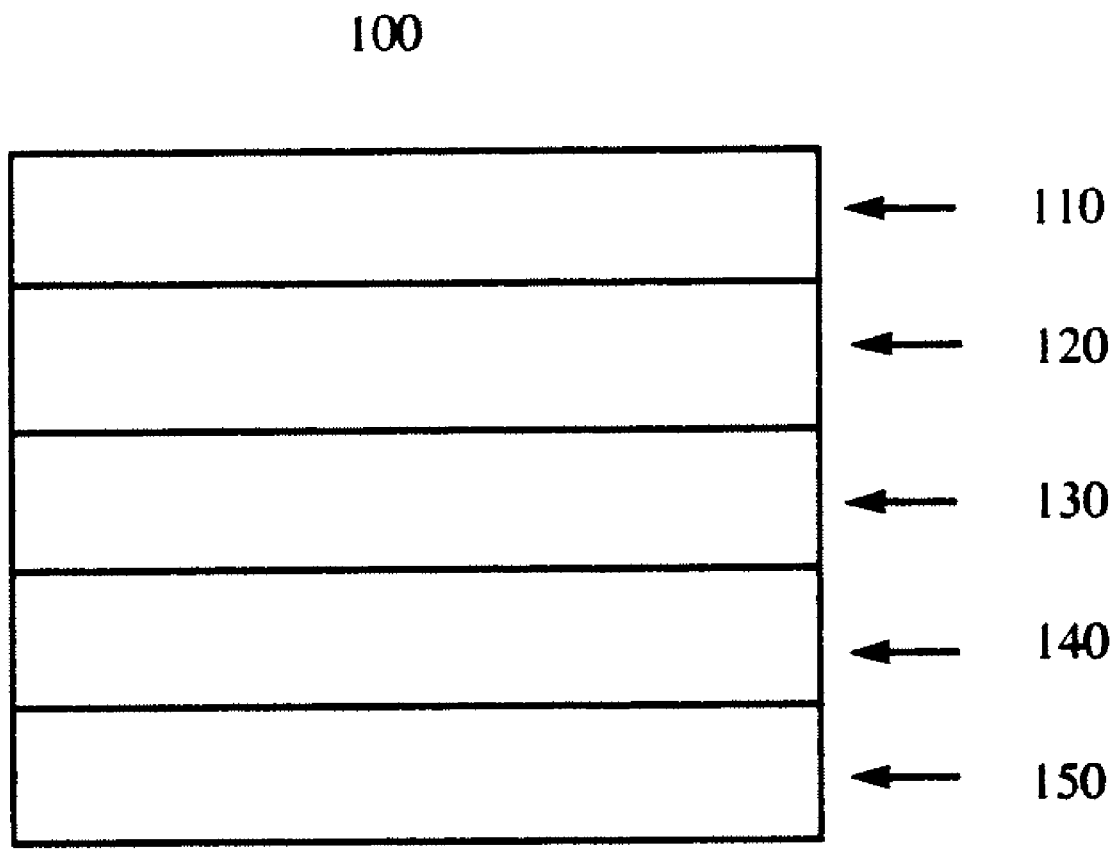
FIG. 1 illustrates an elevational cross-sectional view of an electronic device that includes a hole injection layer according to an embodiment of the present invention.

The present invention relates to aqueous dispersions, methods for making and applying such dispersions, and devices incorporating containing films obtained from such dispersions. The inventive dispersions may comprise at least one conductive polymer such as polyaniline, polypyrroles or polythiophene and their derivatives or combinations thereof, at least one ether containing polymer, and optionally at least one colloid-forming polymeric acids (e.g., at least partially fluorinated ion exchange polymers). As used herein, the term "dispersion" refers to a liquid medium comprising a suspension of minute colloid particles. In accordance with the invention, the "liquid medium" is typically an aqueous liquid, e.g., de-ionized water. As used herein, the term "aqueous" refers to a liquid that has a significant portion of water and in one embodiment it is at least about 40% by weight water. As used herein, the term "ether containing polymer" means a polymer comprising repeating units of the general formula (1)

-Q-R— wherein Q is an oxygen atom or a sulfur atom, and R is a divalent radical of an aromatic or a heteroaromatic or an aliphatic compound, and R includes at least one sulfonic acid, phosphonic acid, boronic acid, or carboxylic acid, either in the acid form or in the neutralized form. As used herein, the term "colloid" refers to the minute particles suspended in the liquid medium, said particles having a particle size up to about 1 micron (e.g., about 20 nanometers to about 800 nanometers and normally about 30 to about 500 nanometers). As used herein, the term "colloid-forming" refers to substances that form minute particles when dispersed in aqueous solution, i.e., "colloid-forming" polymeric acids are not water-soluble. As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Conductive polymers that can be employed in the instant invention can comprise at least one member selected from the group consisting of polyanilines, polythiophenes, polypyrroles, polyacetylenes, polythienothiophene/polystyrenesulfonic acid, polydioxythiophene/polystyrenesulfonic acid, polyaniline-polymeric-acid-colloids, PEDOT, PEDOT-polymeric-acid-colloids and combinations thereof. Conductive polymers can also include selenium containing polymers such as those disclosed in US Patent Application Nos. 2009-0014693 and 2009-0018348; both hereby incorporated by reference.

The electrically conductive polymer may include polymerized units of heterocyclic fused ring monomer units. The conductive polymer can be a polyaniline, polypyrroles or polythiophene and their derivatives or combinations thereof.

Polypyrroles contemplated for use inclusion in the inventive dispersion can comprise Formula I

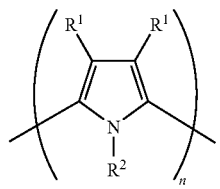

where in Formula I, n is at least about 4; $R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, amidosulfonate, benzyl, carboxylate, ether, ether carboxylate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, amidosulfonate, benzyl, carboxylate, ether, ether carboxylate, ether sulfonate, sulfonate, and urethane.

In one embodiment, $R^1$ is the same or different at each occurrence and is independently selected from hydrogen, alkyl, alkenyl, alkoxy, cycloalkyl, cycloalkenyl, alcohol, amidosulfonate, benzyl, carboxylate, ether, ether carboxylate, ether sulfonate, sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the polypyrrole is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, amidosulfonate, benzyl, carboxylate, ether, ether carboxylate, ether sulfonate, sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—$(CHY)_m$—O—, where m is 2 or 3, and Y is the same or different at each occurrence and is selected from hydrogen, alkyl, alcohol, amidosulfonate, benzyl, carboxylate, ether, ether carboxylate, ether sulfonate, sulfonate, and urethane. In one embodiment, at least one Y group is not hydrogen. In one embodiment, at least one Y group is a substituent having F substituted for at least one hydrogen. In one embodiment, at least one Y group is perfluorinated.

In one embodiment, the polypyrrole used in the new composition comprises a positively charged conductive polymer where the positive charges are balanced by the colloidal polymeric acid anions.

Polythiophenes contemplated for use inclusion in the inventive dispersion can comprise the Formula II below:

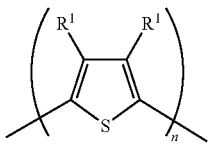

II wherein: $R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, amidosulfonate, benzyl, carboxylate, ether, ether carboxylate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

In one embodiment, both $R^1$ together form —O—$(CHY)_m$—O—, where m is 2 or 3, and Y is the same or different at each occurrence and is selected from hydrogen, alkyl, alcohol, amidosulfonate, benzyl, carboxylate, ether, ether carboxylate, ether sulfonate, and urethane. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the polythiophene comprises a poly[(sulfonic acid-propylene-ether-methylene-3,4-dioxyethylene)thiophene]. In one embodiment, the polythiophene comprises a poly[(propyl-ether-ethylene-3,4-dioxyethylene)thiophene].

In one embodiment of the present invention, the invention uses monomeric, oligomeric and polymeric compositions comprising repeating unit having formula P1, as follows:

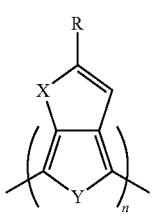

P1 wherein X is S or Se, Y is S or Se, R is a substituent group. n is greater than about 2 and less than 20 and normally about 4 to about 16. R may be any substituent group capable of bonding to the ring structure of P1. R may include hydrogen or isotopes thereof, hydroxyl, alkyl, including $C_1$ to $C_{20}$ primary, secondary or tertiary alkyl groups, arylalkyl, alkenyl, perfluoroalkyl, perfluoroaryl, aryl, alkoxy, cycloalkyl, cycloalkenyl, alkanoyl, alkylthio, aryloxy, alkylthioalkyl, alkynyl, alkylaryl, arylalkyl, amido, alkylsulfinyl, alkoxyalkyl, alkylsulfonyl, aryl, arylamino, diarylamino, alkylamino, dialkylamino, arylarylamino, arylthio, heteroaryl, arylsulfinyl, alkoxycarbonyl, arylsulfonyl, carboxyl, halogen, nitro, cyano, sulfonic acid, or alkyl or phenyl substituted with one or more sulfonic acid (or derivatives thereof), phosphoric acid (or derivatives thereof), carboxylic acid (or derivatives thereof), halo, amino, nitro, hydroxyl, cyano or epoxy moieties. In certain embodiments R may include alpha reactive sites, wherein branched oligomeric, polymeric or copolymeric structures of the selenium containing ring structure may be formed. In certain embodiments, R may include hydrogen, alkylaryl, arylalkyl, aryl, heteroaryl, $C_1$ to $C_{12}$ primary, secondary or tertiary alkyl groups, which may be mono- or polysubstituted by F, Cl, Br, I or CN, and wherein one or more non-adjacent $CH_2$ groups may be replaced, independently with —O—, —S—, —NH—, —NR'—, —SiR'R"—, —CO—, —COO—, —OCO—, —OCO—O—, —S—CO—, —CO—S—, —CH=CH— or —C≡C— in such a manner that O and/or S atoms are not linked directly to one another, phenyl and substituted phenyl groups, cyclohexyl, naphthalenic, hydroxyl, alkyl ether, perfluoroalkyl, perfluoroaryl, carboxylic acids, esters and sulfonic acid groups, perfluoro, $SF_5$, or F. R' and R" are independently of each other H, aryl or alkyl with 1 to 12 C-atoms. The polymer can include end-groups independently selected from functional or non-functional end-groups. The repeating structures according to the present invention may be substantially identical, forming a homopolymer, or may be copolymeric nature by selecting monomers suitable for copolymerization. The repeating unit may be terminated in any suitable manner known in the art and may include functional or non-functional end groups. In addition, dispersions and solutions containing P1 and polymeric acid doped compositions of P1. In one embodiment, the composition includes an aqueous dispersion of a polymeric acid doped polymer according to P1.

In one aspect of the invention, aqueous dispersions comprising electrically conductive polythienothiophenes such as poly(thieno[3,4-b]thiophene) can be prepared when thienothiophene monomers including thieno[3,4-b]thiophene monomers, are polymerized chemically in the presence of at least one partially fluorinated polymeric acid Compositions according to one embodiment of the invention can comprise a continuous aqueous phase in which the poly(thieno[3,4-b]thiophene) and dispersion-forming partially fluorinated polymeric acid are dispersed. Poly(thieno[3,4-b]thiophenes) that can be used in one embodiment of the present invention can comprise the structure (1) and (2):

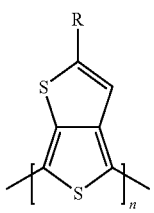

1

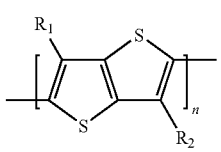

2 wherein R is selected from hydrogen, an alkyl having 1 to 8 carbon atoms, phenyl, substituted phenyl, $C_mF_{2m+1}$, F, Cl, and $SF_5$, and n is greater than about 2 and less than 20 and normally about 4 to about 16.

Thienothiophenes that can be used in the compositions of this invention may also have the structure (2) as provided above, wherein $R_1$ and $R_2$ are independently selected from the list above. In one particular embodiment, the polythienothiophene comprises poly(thieno[3,4-b]thiophene) wherein R comprises hydrogen.

Another aspect of the invention comprises the conductive polymer poly(selenolo[2,3-c]thiophene). The polymers for use with this disclosure may comprise copolymers further comprising polymerized units of an electroactive monomer. Electroactive monomers may comprise at least one member selected from the group consisting of thiophenes, thieno[3,4-b]thiophene, thieno[3,2-b]thiophene, substituted thiophenes, substituted thieno[3,4-b]thiophenes, substituted thieno[3,2-b]thiophene, dithieno[3,4-b:3',4'-d]thiophene, selenophenes, substituted selenophenes, pyrrole, bithiophene, substituted pyrroles, phenylene, substituted phenylenes, naphthalene, substituted naphthalenes, biphenyl and terphenyl, substituted terphenyl, phenylene vinylene, substituted phenylene vinylene, fluorene, substituted fluorenes. Examples of suitable monomers and polymers are described in U.S. patent application Ser. Nos. 12/353,609, filed on Jan. 14, 2009 and 12/353,461 also filed on Jan. 14, 2009; the disclosure of both of which is hereby incorporated by reference. In addition to electroactive monomers, the copolymers according to the present invention may comprise polymerized units of a non-electroactive monomers.

Polyaniline compounds which can be used in the present invention can be obtained from aniline monomers comprising Formula III below:

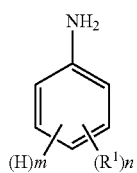

III wherein n is an integer from 0 to 4; m is an integer from 1 to 5, with the proviso that n+m=5; and R1 is independently selected so as to be the same or different at each occurrence and is selected from alkyl, alkenyl, alkoxy, cycloalkyl, cycloalkenyl, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two R1 groups together may form an alkylene or alkenylene chain completing a 3, 4, 5, 6, or 7-membered aromatic or alicyclic ring, which ring may optionally include one or more divalent nitrogen, sulfur or oxygen atoms.

The polymerized material comprises aniline monomer units, each of the aniline monomer units can comprise a formula selected from Formula IV below:

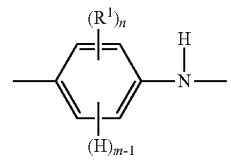

IV or Formula V below:

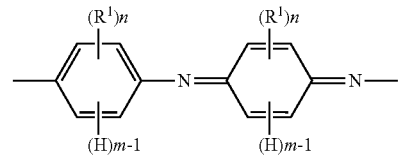

V wherein n, m, and R1 are as defined above. In addition, the polyaniline may comprise a homopolymer or a co-polymer of two or more aniline monomeric units.

The compositions of the present invention are not limited to the homopolymeric structures above and may include heteropolymeric or copolymeric structures. The copolymeric structures may be any combination of alternating copolymers (e.g., alternating A and B units), periodic copolymers (e.g., (A-B-A-B-B-A-A-A-A-B-B-B)n, random copolymers (e.g., random sequences of monomer A and B), statistical copolymers (e.g., polymer sequence obeying statistical rules) and/or block copolymers (e.g., two or more homopolymer subunits linked by covalent bonds). The copolymers may be branched or linked, provided the resultant copolymer maintains the properties of electrical conductivity.

The ether containing polymer of the present invention comprises repeating units of the general formula (1)

—Q—R—                                                             (1)

wherein Q is an oxygen atom or a sulfur atom, and R is a divalent radical of an aromatic or a heteroaromatic or an aliphatic compound, and R includes at least one sulfonic acid, phosphonic acid, boronic acid, or carboxylic acid, either in the acid form or in the neutralized form.

The ether containing polymers of the present display a number of advantages. These include: improved thermal stability, high glass transition temperature, excellent film forming property, reduced water uptake, defined adjustable functional groups for the most different technical applications.

The ether containing polymer of the present invention comprises repeating units of the general formula (1), wherein R is a divalent radical of an aromatic or a heteroaromatic or an aliphatic compound, and can include C, H, O, N, S, N, B, P, Si, or halogen atoms, and has at least in part substituents of the general formula (2A), (2B), (2C), and/or (2D), wherein the radicals $R_1$ independently of one another, and is a direct bond, or selected from a group having from 1 to 60 carbon atoms, for example, a branched or unbranched alkyl or cycloalkyl group or substituted or an aryl group or a hetero aryl group. $R_1$ can be optionally substituted with silicon atom, halogen atoms, nitro group, amino group, cyano group. For example, $R_1$ can be substituted with halogen atoms such as wherein $R_1$ is with fluorine atom. X is independently of one another, and is hydrogen, a one- or multivalent cation, such as at least one member from the group of $Li^+$, $Na^+$, $K^+$, $R^+$, $Cs^+$, $TiO^{2+}$, $ZrO^{2+}$, $Ti^{4+}$, $Zr^{4+}$, $Ca^{2+}$, $Mg^{2+}$ or an ammonium ion.

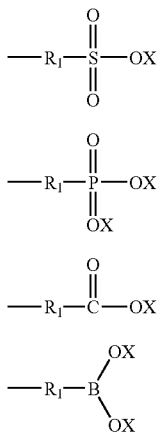 (2A)
(2B)
(2C)
(2D)

The ether containing polymer of the invention has repeating units of the general formula (1), specifically repeating units corresponding to the general formulae (3A), (3B), (3C), (3D), (3E), (3F), (3G), (3H), (3I), (3J), and combinations thereof.

 (3A)

wherein Y is an oxygen or sulfur; and
$R_2$ is a divalent radical of an aromatic of 6 to 40 carbon atoms, or a heteroaromatic of 4 to 40 carbon atoms, or an alkyl or cycloalkyl group of 1 to 40 carbon atoms, and $R_2$ has at least in part substituents of the general formula (2A), (2B), (2C), and/or (2D).

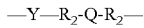

wherein Q is selected from —S—, —S(O)—, —S(O)$_2$—, —C(O)—, —P(O)(C$_6$H$_5$)—, and combinations thereof;

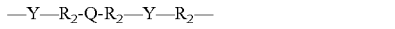 (3B)

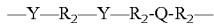 (3C)

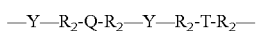 (3D)

wherein T is a direct bond, or selected from —P(O)(C$_6$H$_5$)—, —CH$_2$—, —C(CH$_3$)(C$_6$H$_5$)—, —C(CH$_3$)$_2$—, —C(CF$_3$)$_2$—, —Si(CH$_3$)$_2$—, —Si(C$_6$H$_5$)$_2$—, —Si(t-Bu)$_2$—, —C(O)—, —C(CF$_3$)(C$_6$H$_5$)—, —C(CH$_3$)(CF$_3$)—, —S(O)$_2$—, and combination thereof;

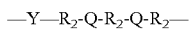 (3E)

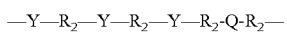 (3F)

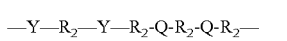 (3G)

 (3H)

 (3I)

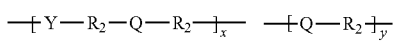 (3J)

wherein 0<x≦100%, 0≦y<100%, and x+y=100% based on the number of all repeating units;

In the context of the present invention, the number of the repeating units of the general formula (1) along one macromolecule chain of the polymer can be an integer greater than or equal to 10, in particular greater than or equal to 25. The number of repeating units of the general formula (3A), (3B), (3C), (3D), (3E), (3F), (3G), (3H), (3I), and (3J), along one macromolecule chain of the polymer can be an integer greater than or equal to 10, in particular greater than or equal to 25. Typically the ether containing polymers of the present invention have a weight average molecular weight in the range of 5,000 to 1,000,000 g/mol, such as 10,000 g/mol to 500,000 g/mol.

More specifically, the ether containing polymer of the invention has repeating units of the general formula (1), corresponding to the general formulae (4A), (4B), (4C), (4D), (4E), (4F), (4G), (4H), (4I), (4J), (4K), (4L), (4M), (4N), (4O), (4P), (4Q), (4R), (4S), (4T), (4U), and combinations thereof.

—Y—R$_2$— (4A)

wherein Y is an oxygen or sulfur; and
$R_2$ is a divalent radical of an aromatic of 6 to 40 carbon atoms, or a heteroaromatic of 4 to 40 carbon atoms, or an alkyl or cycloalkyl group of 1 to 40 carbon atoms, and $R_2$ has at least in part substituents of the general formula of (2A), (2B), (2C), and/or (2D).

 (4B)

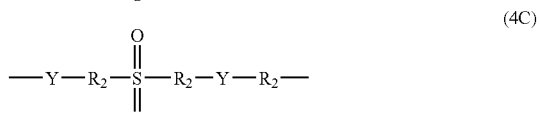 (4C)

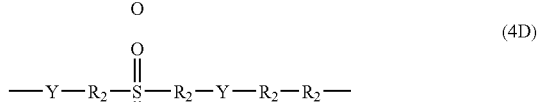 (4D)

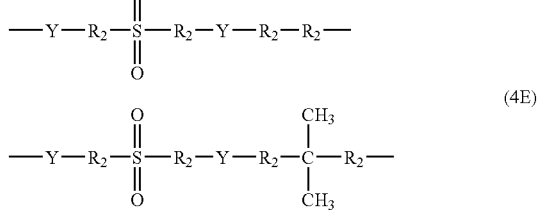 (4E)

(4F)

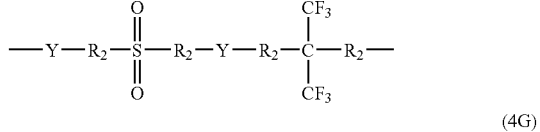 (4G)

wherein 0<x≦100%, 0≦y<100%, and x+y=100% based on the number of all repeating units

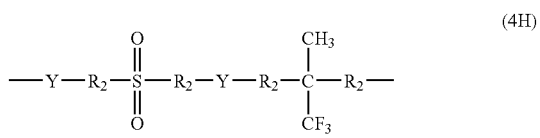 (4H)

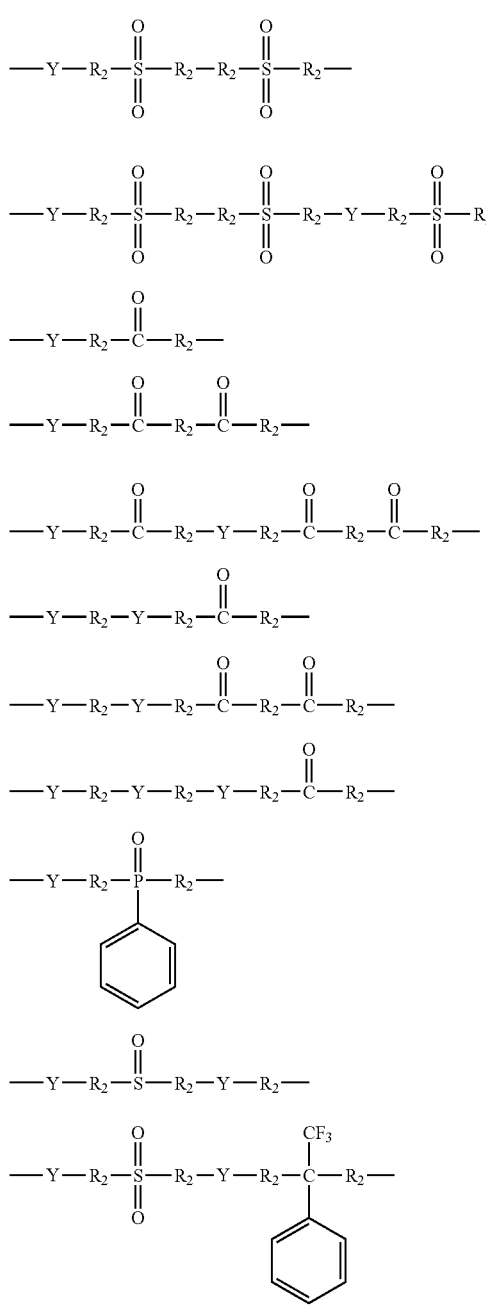

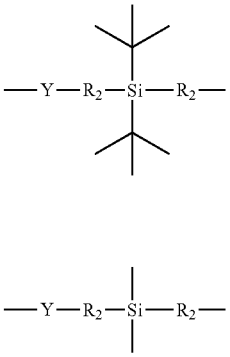

The ether containing polymer of the present invention with repeating units of general formula (1) can include one or the combination of more than one of the above general formulae (4A) to (4U), wherein $R_2$ is dependent of one another, is identical or different, and is a divalent radical of an aromatic of 6 to 40 carbon atoms, or a heteroaromatic of 4 to 40 carbon atoms, or an alkyl or cycloalkyl group of 1 to 40 carbon atoms, and $R_2$ has at least in part substituents of the general formula of (2A), (2B), (2C), and/or (2D). For example, $R_2$ can be phenylene, phenylene, phenylene, 4,4'-biphenyl, naphthalene, phenanthrene, pyridine, thiophene, pyrrole, 4,4'-bipyridine, or 2,2'-bipyridine. The substitution pattern of the aromatic and/or heteroaromatic is arbitrary, in the case of phenylene, for example, $R_2$ may be ortho-, meta- and para-phenylene.

The ether containing polymer of the present invention with repeating units of the general formula (1) include aromatic polyethers, such as polyphenylene oxide, polysulfones, polyether ketones, aromatic thioethers, such as polyphenylene sulfide, aliphatic polyether such as poly(ethylene oxide), poly(propylene oxide), and poly(epichlorohydrin).

The ether containing polymers with repeating units of the general formula (1) that are useful in the context of the present invention include homopolymers and copolymers, and copolymers can be random or block or graft copolymers. Examples of useful polymers are polyaryl ethers, polyaryl thioethers, polysulfones, and polyether ketones.

The following polymer structures constitute specific examples of useful repeating units of the polymer backbone satisfying the requirement of this invention, and these polymers have at least one substituent of the general formula (2A), (2B), (2C), and/or (2D) as side chain.

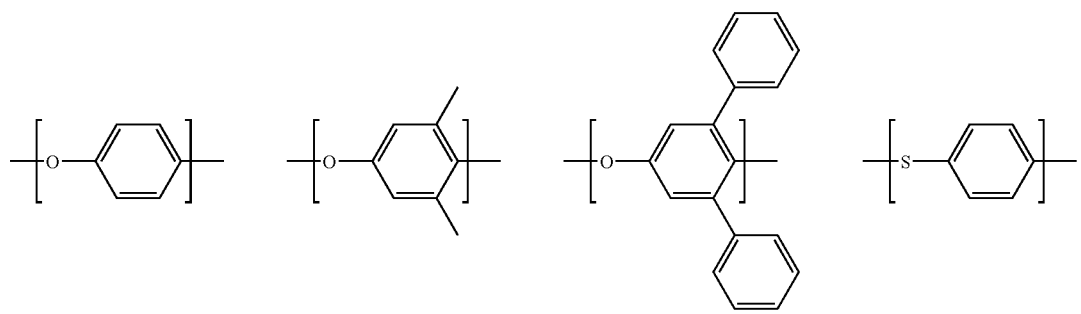

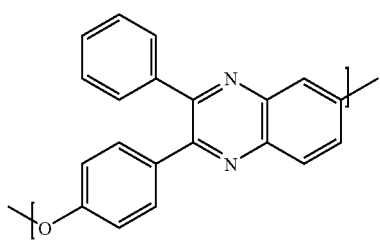
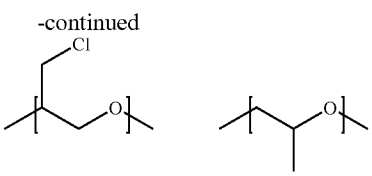
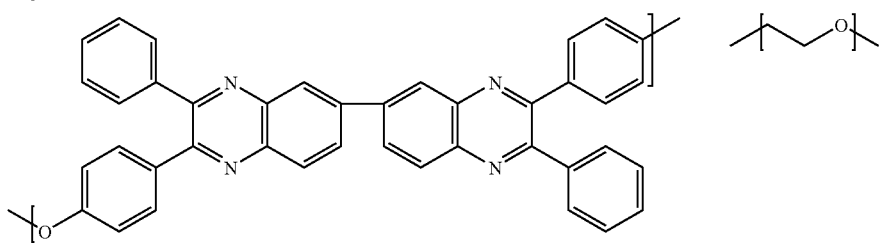
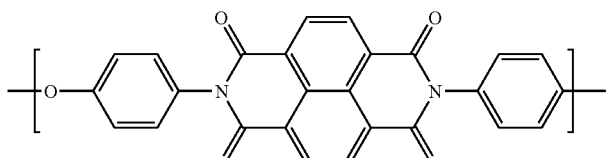
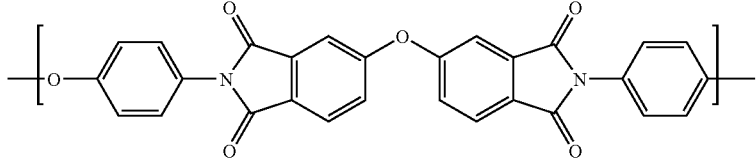
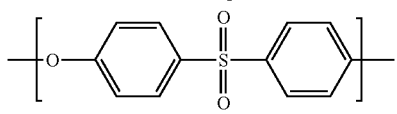
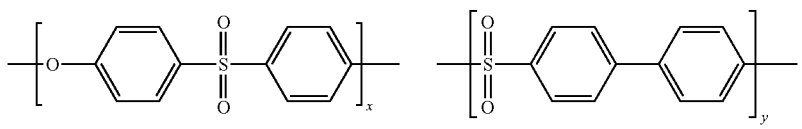
wherein $0<x\leqq100\%$, $0\leqq y<100\%$, and $x+y=100\%$ based on the number of all repeating units;
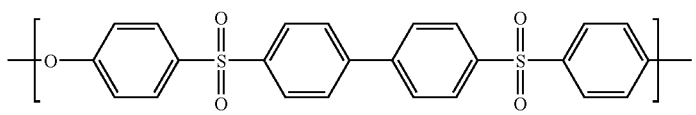
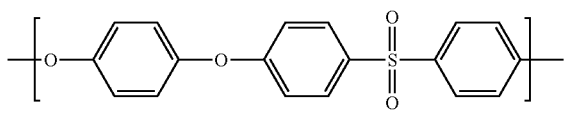
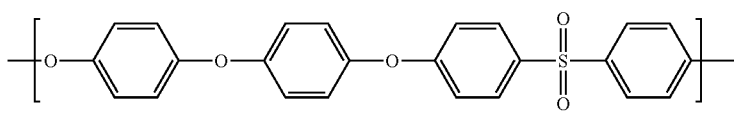
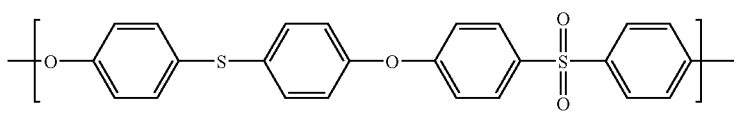

-continued
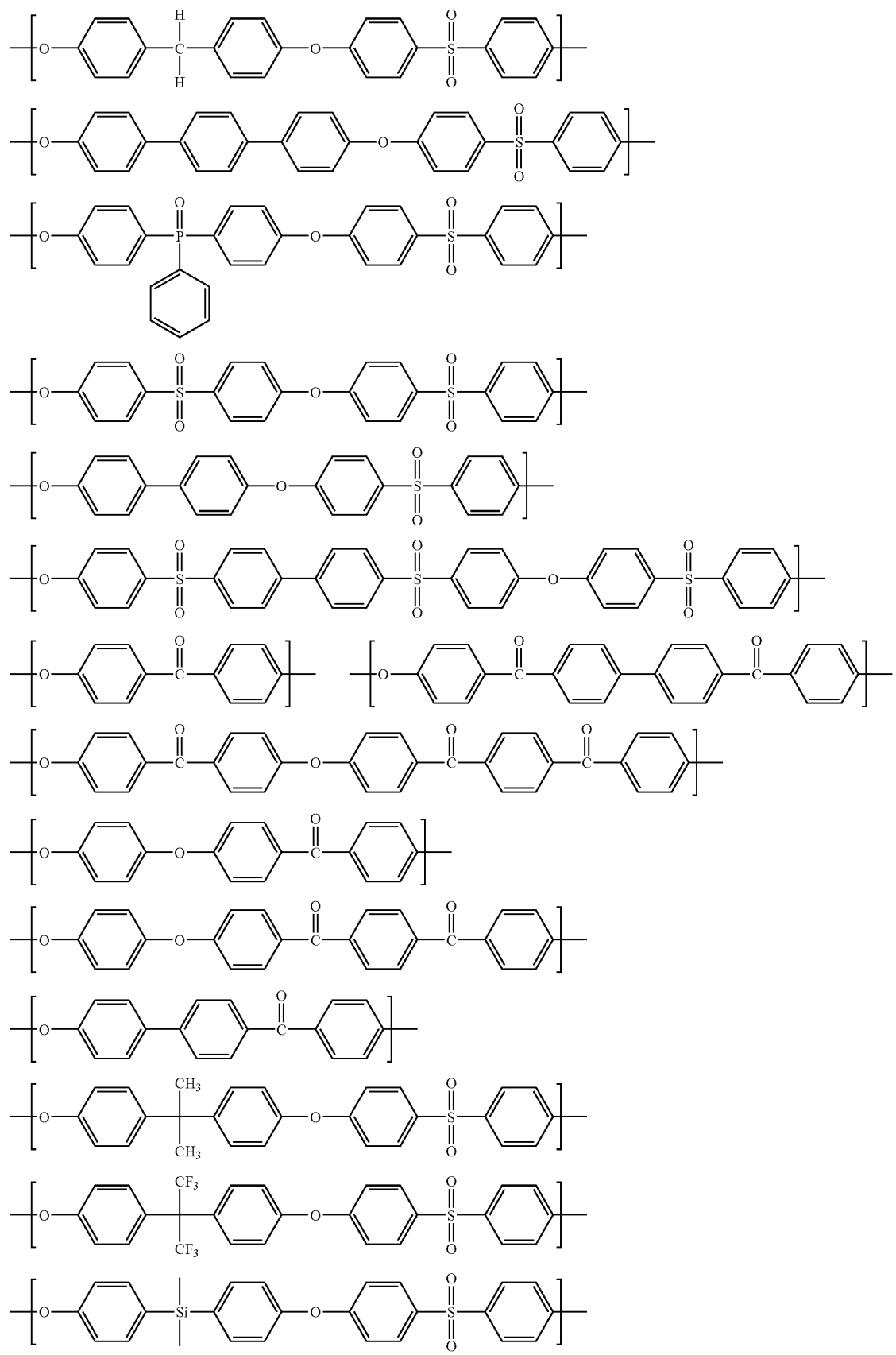

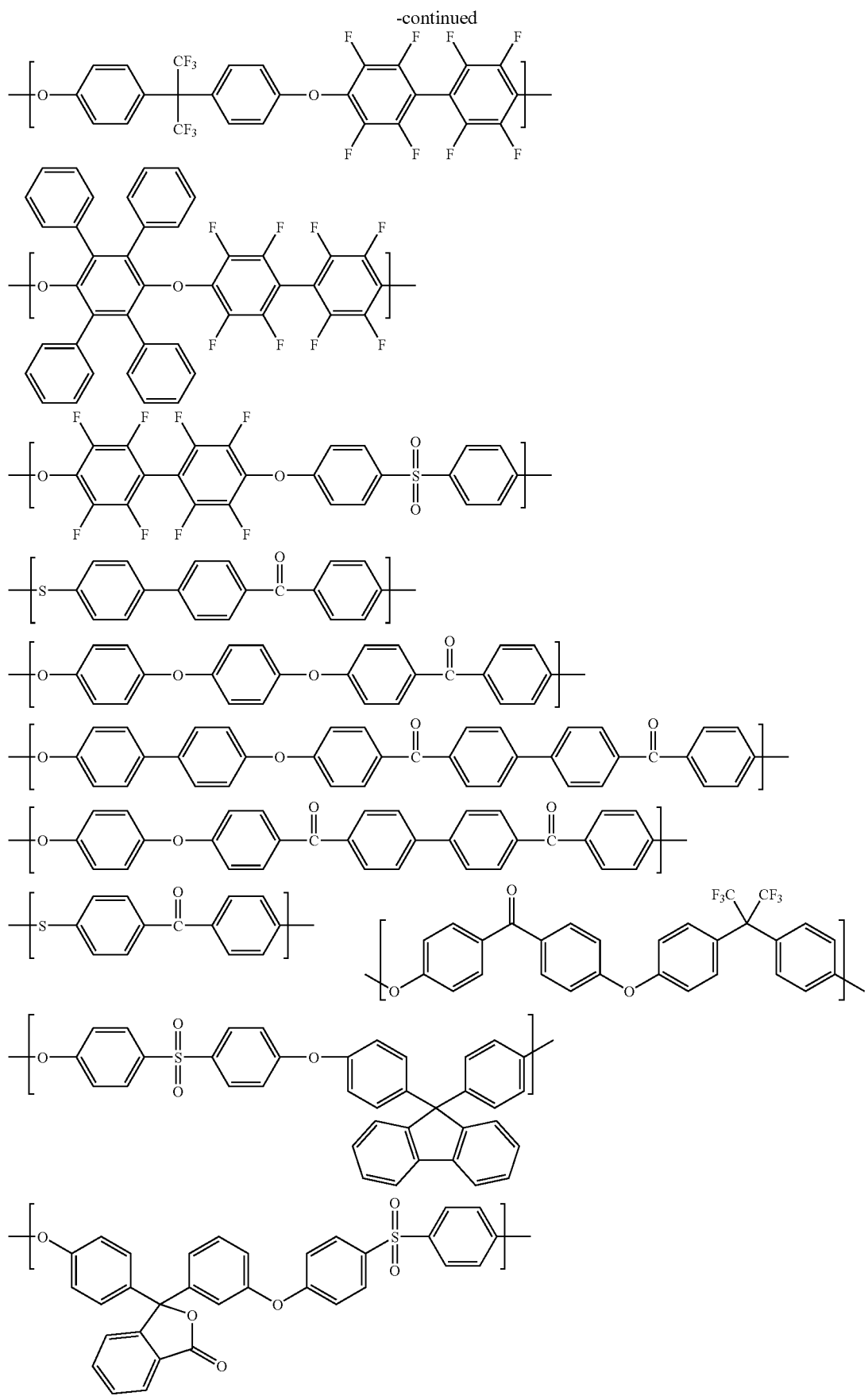

-continued
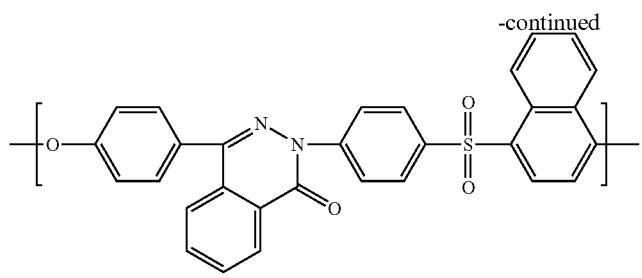
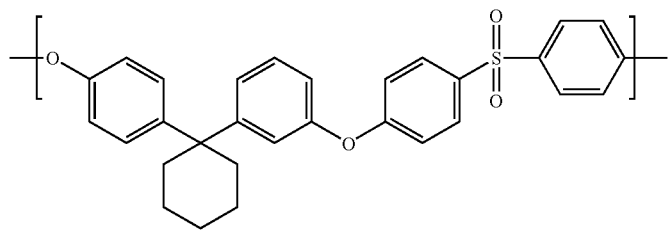
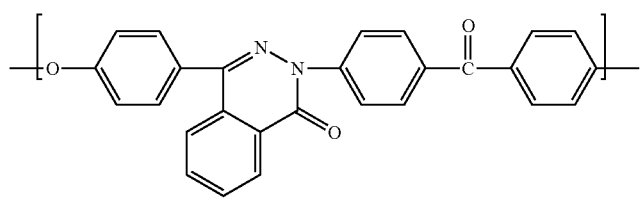
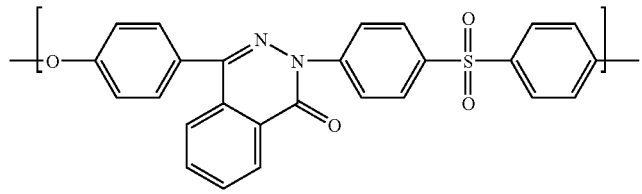
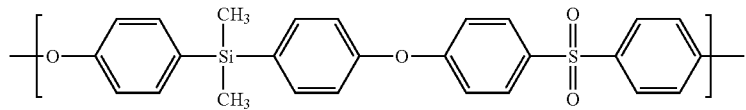
Examples of polymers that can be used in accordance with the invention are polymers with repeating units of the following structures.
Polymer 1
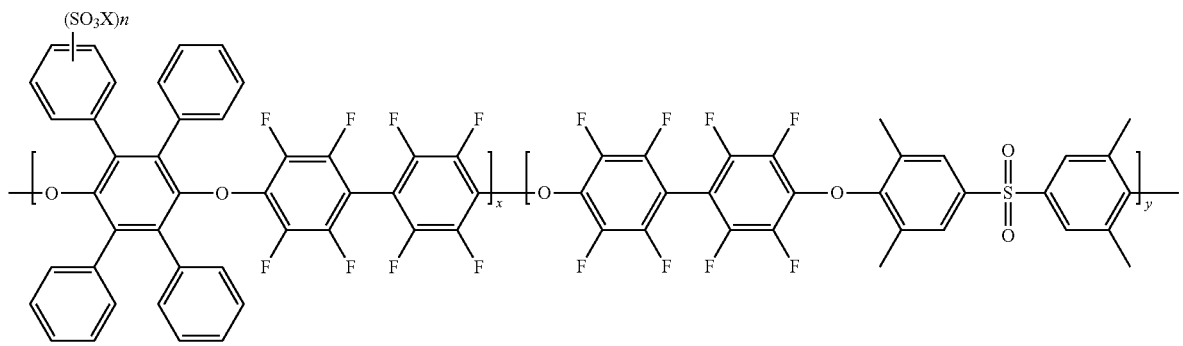

wherein X is independently of one another, and is hydrogen, a one- or multivalent cation, such as $Li^+$, $Na^+$, $K^+$, $Rb^+$, $Cs^+$, $TiO^{2+}$, $ZrO^{2+}$, $Ti^{4+}$, $Zr^{4+}$, $Ca^{2+}$, $Mg^{2+}$ or an ammonium ion;
wherein $0 < x \leqq 100\%$, $0 \leqq y < 100\%$, and $x+y=100\%$ based on the number of all repeating units; and
n is an integer of 1 to 4.
Polymer 2
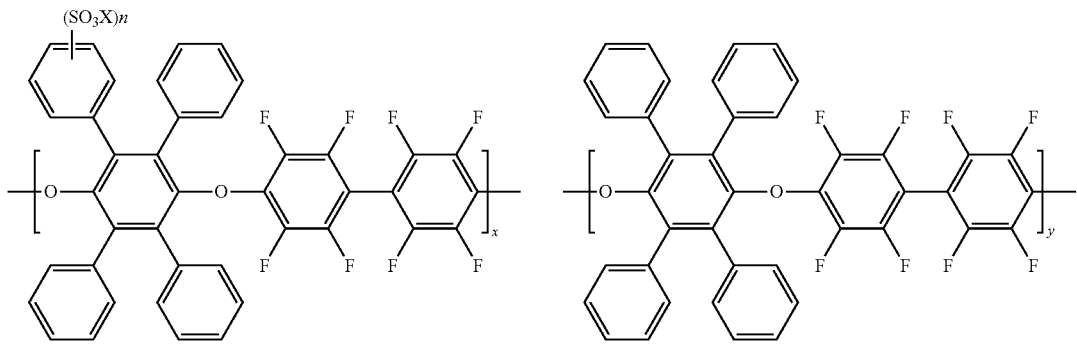
Polymer 3
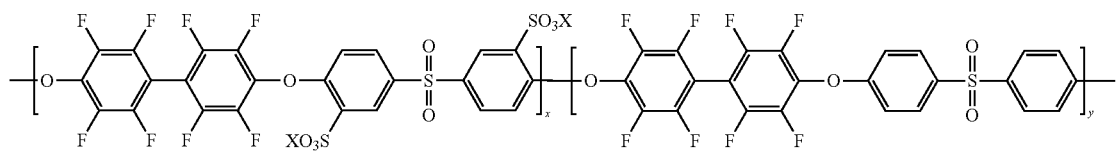
Polymer 4
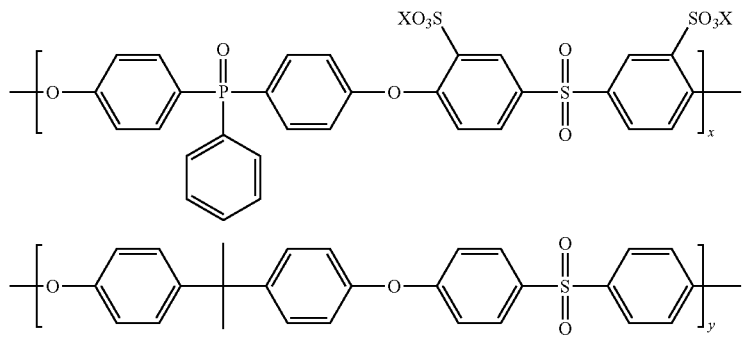
Polymer 5
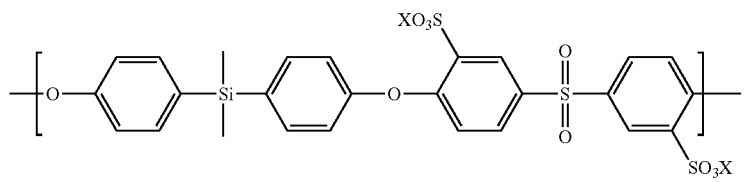
Polymer 6
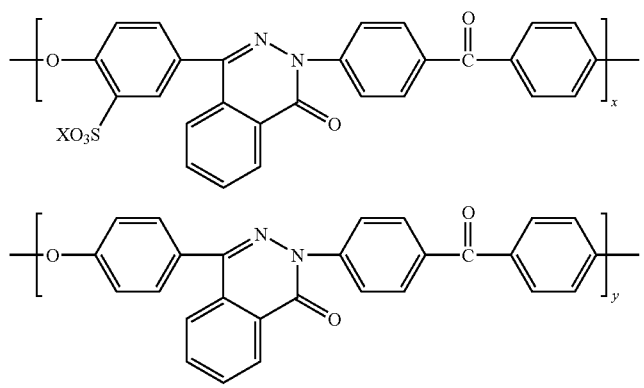

-continued
Polymer 7
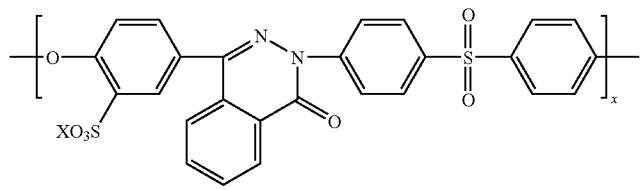
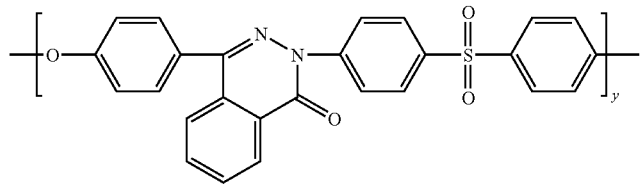
Polymer 8
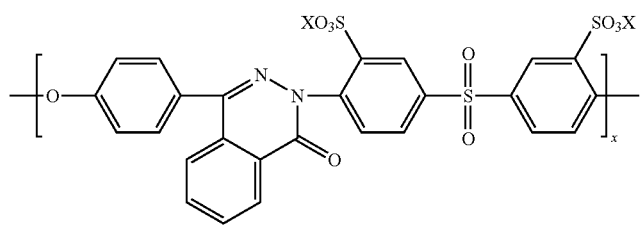
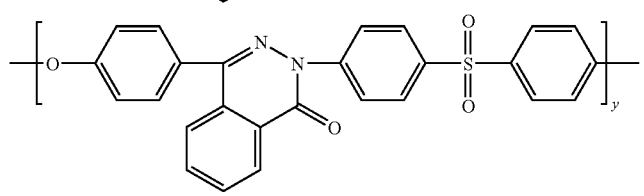
Polymer 9
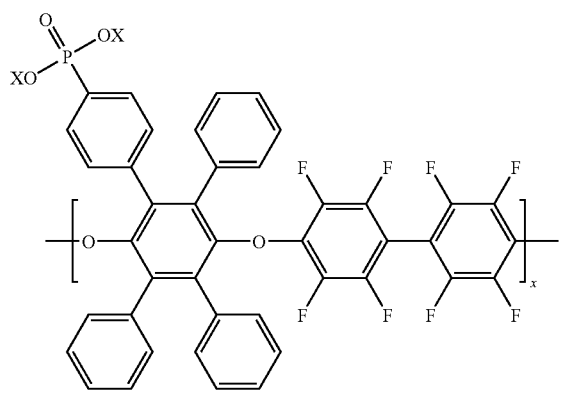
Polymer 10
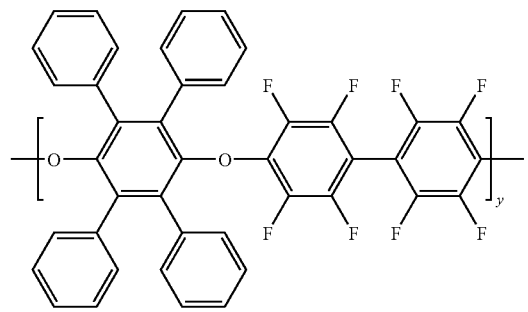
Polymer 11
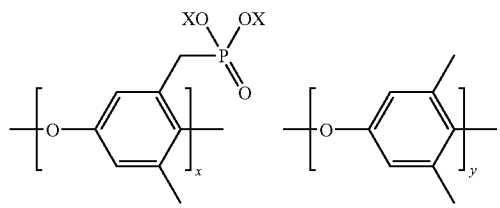
Polymer 12
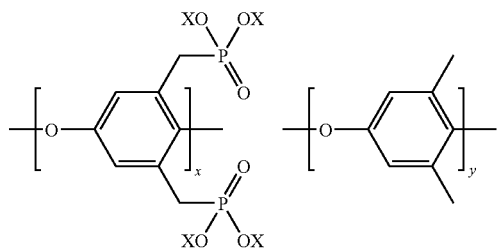
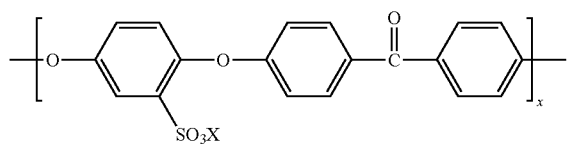
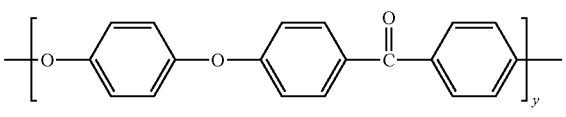

-continued
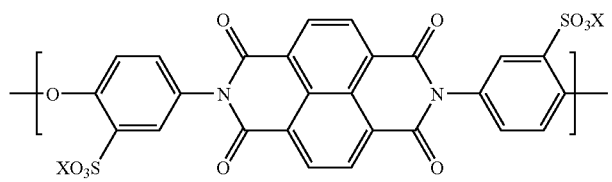
Polymer 13
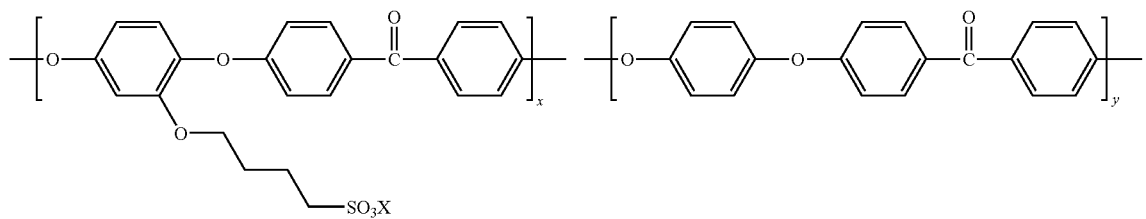
Polymer 14
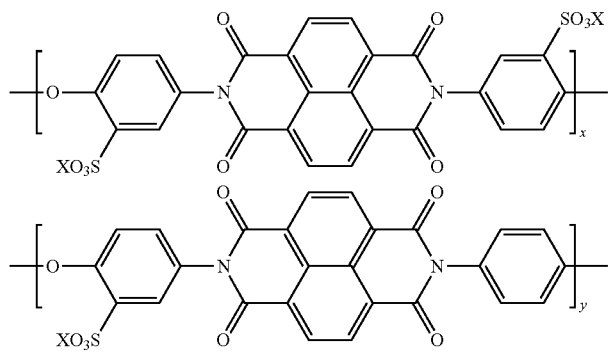
Polymer 15
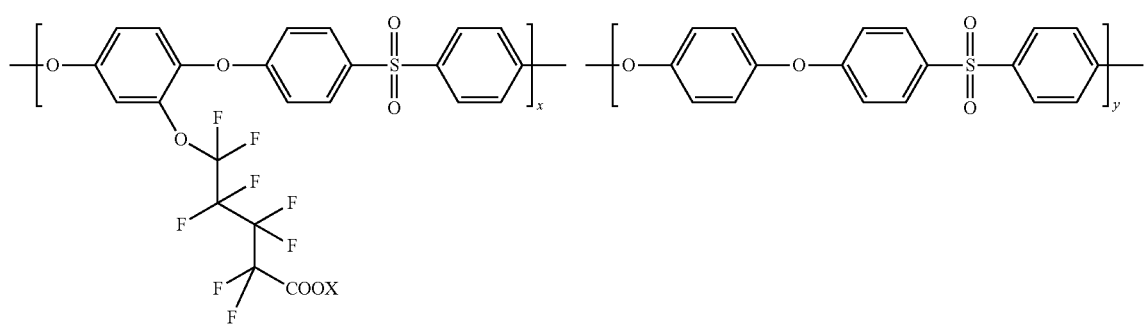
Polymer 16
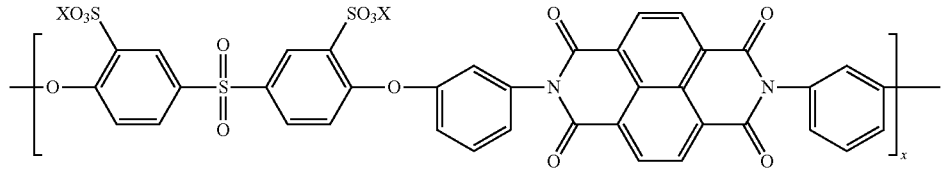
Polymer 17
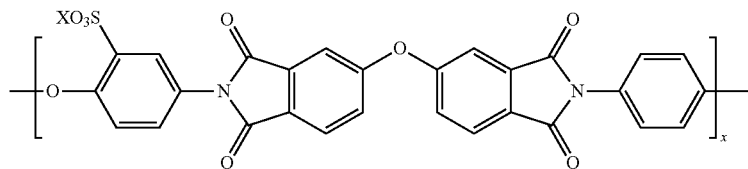
Polymer 18

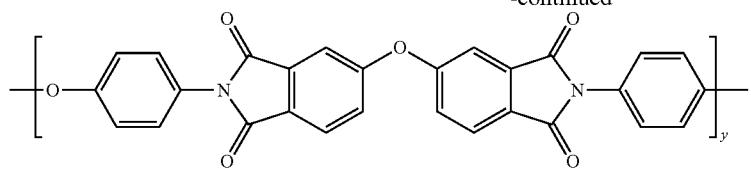
Polymer 19
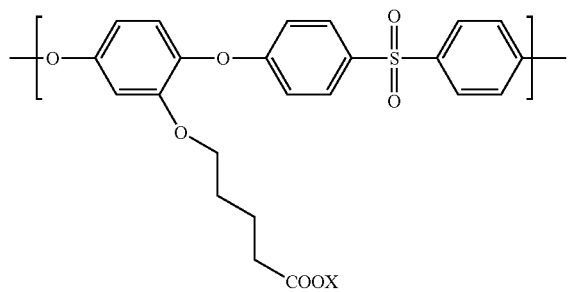
Polymer 20
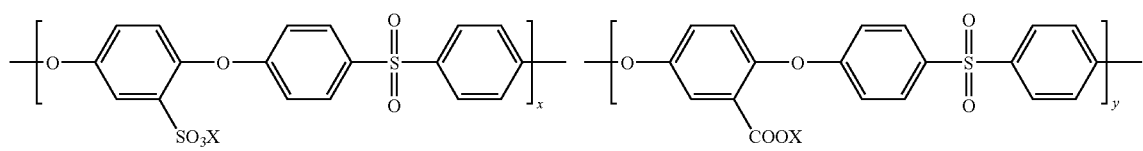
Polymer 21
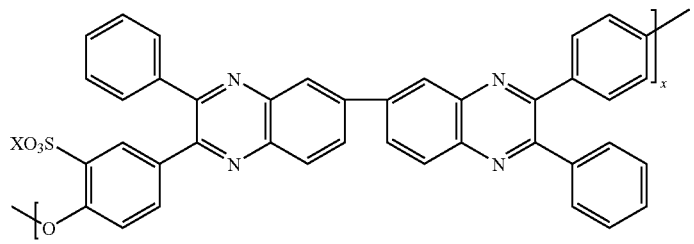
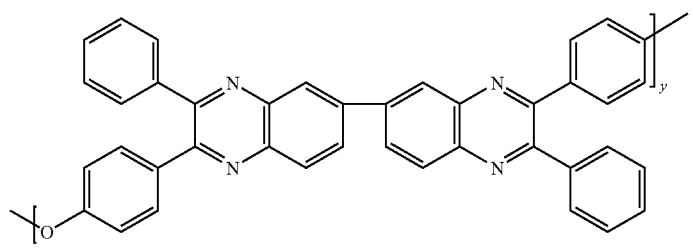
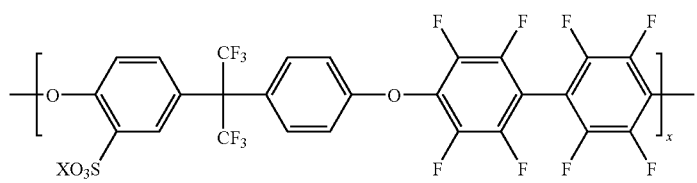
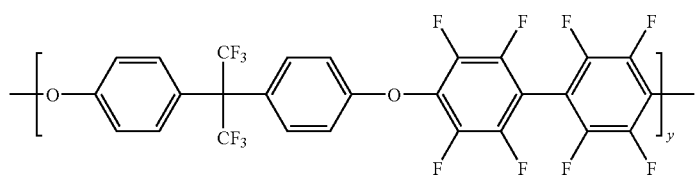

-continued
Polymer 22
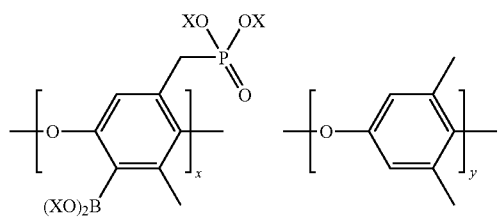
Polymer 23
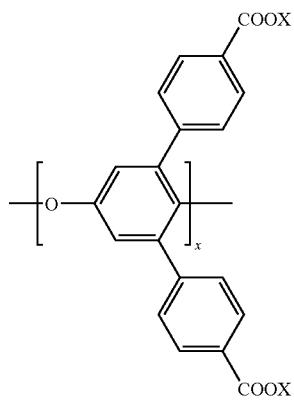
Polymer 24
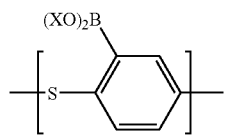
Polymer 25
Polymer 26
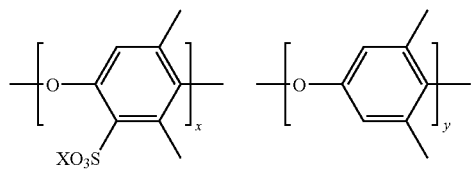
Polymer 27
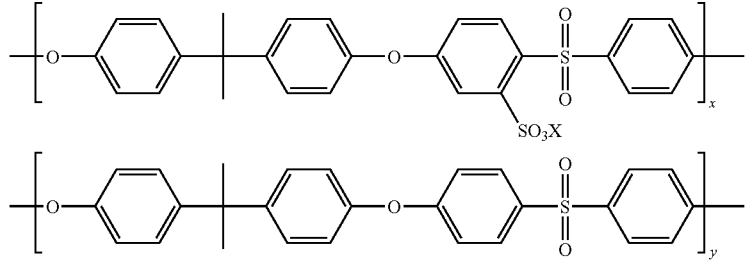
Polymer 28
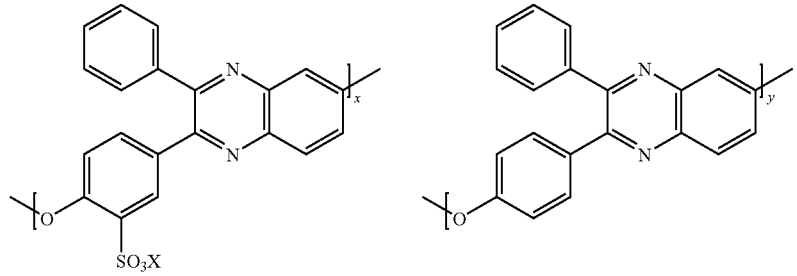
Polymer 29
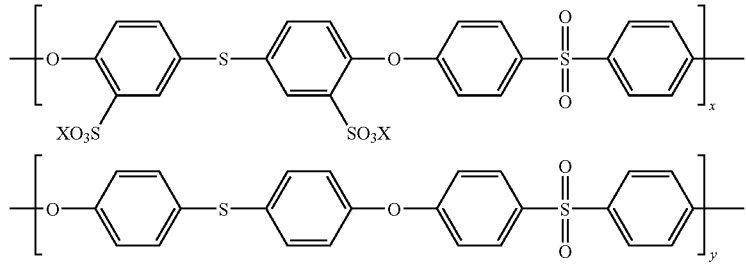

-continued
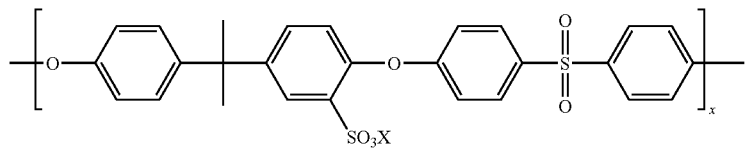
Polymer 30
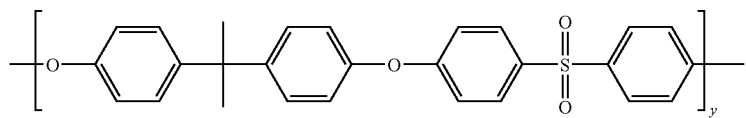
Polymer 31
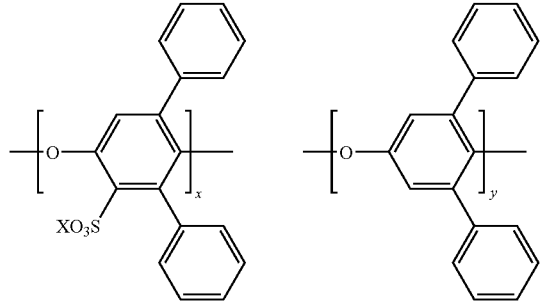
Polymer 32
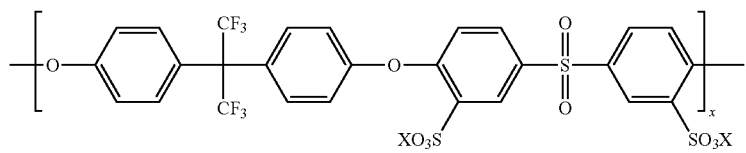
Polymer 33
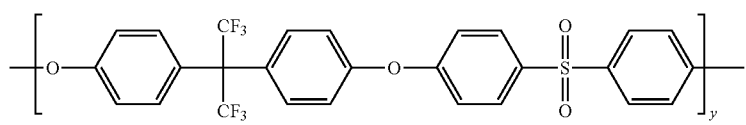
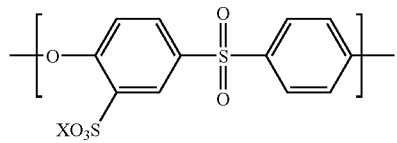
Polymer 34
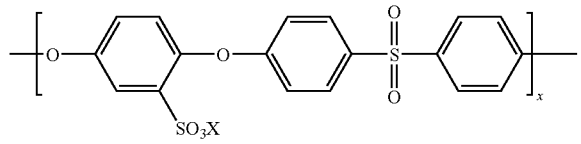
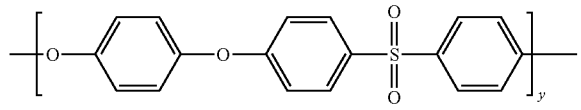
Polymer 35
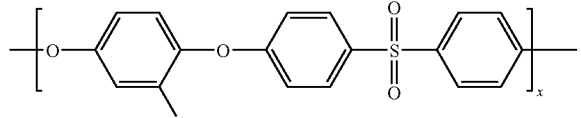
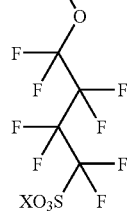

-continued
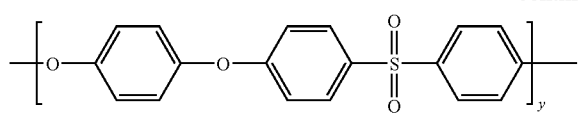
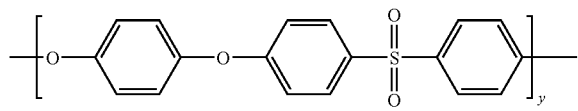
Polymer 36
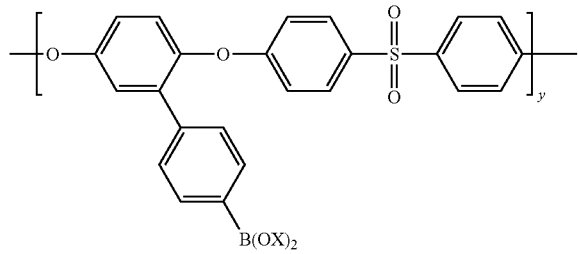
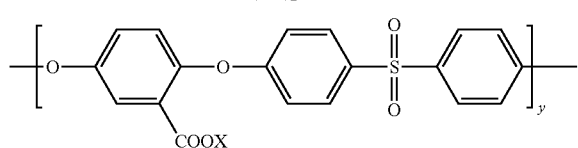
Polymer 37
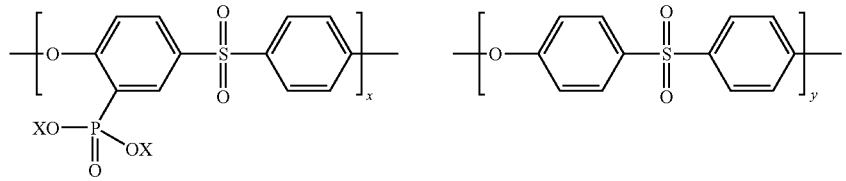
Polymer 39
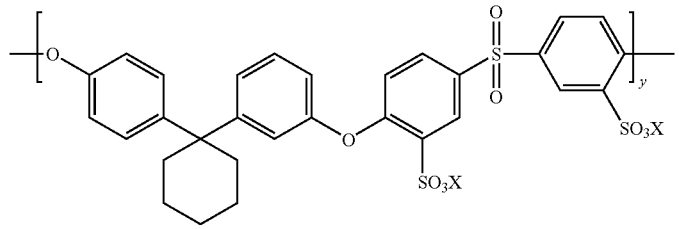
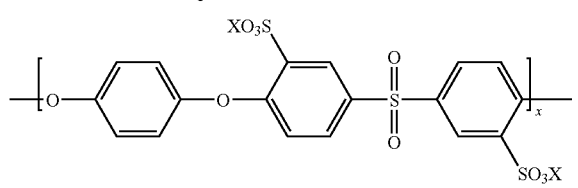
Polymer 40
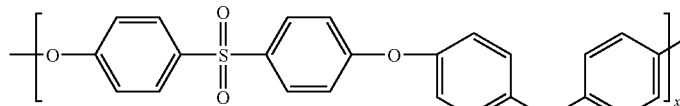
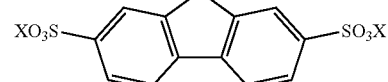
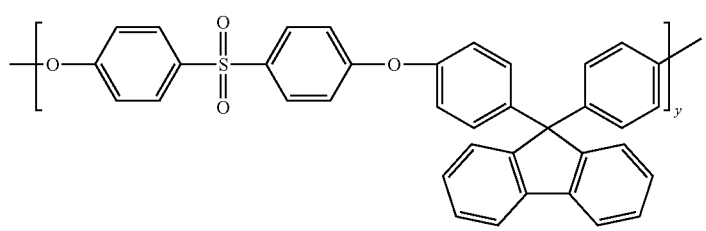

The optional colloid-forming polymeric acids contemplated for use in the practice of the invention are insoluble in water, and form colloids when dispersed into a suitable aqueous medium. The polymeric acids typically have a molecular weight in the range of about 10,000 to about 4,000,000. In one embodiment, the polymeric acids have a molecular weight of about 50,000 to about 2,000,000. Any polymeric acid that is colloid-forming when dispersed in water is suitable for use in the practice of the invention. In one embodiment, the colloid-forming polymeric acid comprises polymeric sulfonic acid. Other acceptable polymeric acids comprise at least one member of polymer phosphoric acids, polymer carboxylic acids, and polymeric acrylic acids, and mixtures thereof, including mixtures having polymeric sulfonic acids. In another embodiment, the polymeric sulfonic acid comprises a fluorinated acid. In still another embodiment, the colloid-forming polymeric sulfonic acid comprises a perfluorinated compound. In yet another embodiment, the colloid-forming polymeric sulfonic acid comprises a perfluoroalkylenesulfonic acid.

In still another embodiment, the optional colloid-forming polymeric acid comprises a highly-fluorinated sulfonic acid polymer ("FSA polymer"). "Highly fluorinated" means that at least about 50% of the total number of halogen and hydrogen atoms in the polymer are fluorine atoms, and in one embodiment at least about 75%, and in another embodiment at least about 90%. In one embodiment, the polymer comprises at least one perfluorinated compound.

The optional polymeric acid can comprise sulfonate functional groups. The term "sulfonate functional group" refers to either sulfonic acid groups or salts of sulfonic acid groups, and in one embodiment comprises at least one of alkali metal or ammonium salts. The functional group is represented by the formula —$SO_3X$ where X comprises a cation, also known as a "counterion". X can comprise at least one member selected from the group consisting of H, Li, Na, K or $N(R_1")(R_2")(R_3)(R_4)$, and $R_1"$, $R_2"$, $R_3$, and $R_4$ are the same or different, and are in one embodiment H, $CH_3$ or $C_2H_5$. In another embodiment, X comprises H, in which case the polymer is said to be in the "acid form". X may also be multivalent, as represented by such ions as $Ca^{2+}$, $Al^{3+}$, $Fe^{2+}$ and $Fe^{3+}$. In the case of multivalent counterions, represented generally as $M^{n+}$, the number of sulfonate functional groups per counterion will be equal to the valence "n".

In one embodiment, the optional FSA polymer comprises a polymer backbone with recurring side chains attached to the backbone, the side chains carrying cation exchange groups. Polymers include homopolymers or copolymers of two or more monomers. Copolymers are typically formed from a nonfunctional monomer and a second monomer carrying a cation exchange group or its precursor, e.g., a sulfonyl fluoride group (—$SO_2F$), which can be subsequently hydrolyzed to a sulfonate functional group. For example, copolymers comprising a first fluorinated vinyl monomer together with a second fluorinated vinyl monomer having a sulfonyl fluoride group (—$SO_2F$) can be used. Examples of suitable first monomers comprise at least one member from the group of tetrafluoroethylene (TFE), hexafluoropropylene, vinyl fluoride, vinylidene fluoride, trifluoroethylene, chlorotrifluoroethylene, perfluoro(alkyl vinyl ether), and combinations thereof. TFE is a desirable first monomer.

In other embodiments, examples of optional second monomers comprise at least one fluorinated vinyl ether with sulfonate functional groups or precursor groups which can provide the desired side chain in the polymer. Additional monomers include ethylene. In one embodiment, FSA polymers for use in the present invention comprise at least one highly fluorinated FSA, and in one embodiment perfluorinated, carbon backbone and side chains represented by the formula

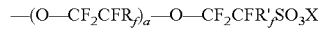

wherein $R_f$ and $R'_f$ are independently selected from F, Cl or a perfluorinated alkyl group having 1 to 10 carbon atoms, a=0, 1 or 2, and X comprises at least one of H, Li, Na, K or $N(R_1')(R_2')(R_3)(R_4)$ and $R_1"$, $R_2"$, $R_3$, and $R_4$ are the same or different and are and in one embodiment H, $CH_3$ or $C_2H_5$. In another embodiment X comprises H. As stated above, X may also be multivalent.

In another embodiment, the optional FSA polymers include, for example, polymers disclosed in U.S. Pat. Nos. 3,282,875, 4,358,545 and 4,940,525 (all hereby incorporated by reference in their entirety). An example of a useful FSA polymer comprises a perfluorocarbon backbone and the side chain represented by the formula

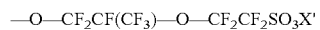

where X' is as defined above. FSA polymers of this type are disclosed in U.S. Pat. No. 3,282,875 and can be made by copolymerization of tetrafluoroethylene (TFE) and the perfluorinated vinyl ether $CF_2$=CF—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3X'$, wherein X' is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

In another embodiment, the optional FSA polymers include, for example, polymers disclosed in US 2004/0121210 A1; hereby incorporated by reference in its entirety. An example of a useful FSA polymer can be made by copolymerization of tetrafluoroethylene (TFE) and the perfluorinated vinyl ether $CF_2$=CF—O—$CF_2CF_2CF_2CF_2SO_2F$ followed by conversion to sulfonate groups by hydrolysis of the sulfonyl fluoride groups and ion exchanged as desired to convert the fluoride groups to the desired ionic form. In another embodiment, the FSA polymers include, for example, polymers disclosed in US2005/0037265 A1; hereby incorporated by reference in its entirety. An example of a useful FSA polymer can be made by copolymerization of $CF_2$=$CFCF_2OCF_2CF_2SO_2F$ and tetrafluoroethylene followed by conversion to sulfonate groups by KOH hydrolysis of the sulfonyl fluoride groups and ion exchanged with acid to convert the potassium ion salt to the acid form.

In other embodiments, the optional FSA polymers for use in this invention typically have an ion exchange ratio of less than about 33. "Ion exchange ratio" or "IXR" is meant as the number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form sufficient to neutralize one equivalent of sodium hydroxide. In the case of a sulfonate polymer where the polymer has a perfluorocarbon backbone and the side chain comprises —O—CF$_2$—CF(CF$_3$)—O—CF$_2$—CF$_2$—SO$_3$H (or a salt thereof), the equivalent weight range which corresponds to an IXR of about 8 to about 23, is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525 (hereby incorporated by reference in their entirety), e.g., the polymer having the side chain —O—CF$_2$CF$_2$SO$_3$H (or a salt thereof), the equivalent weight is somewhat lower because of the lower molecular weight of the monomer unit containing a cation exchange group. For an IXR range of about 8 to about 23, the corresponding equivalent weight range is about 575 EW to about 1325 EW. IXR for this polymer can be related to equivalent weight using the formula: 50 IXR+178=EW.

The optional FSA polymers can be prepared as colloidal aqueous dispersions. They may also be in the form of dispersions in other media, examples of which include, without limitation, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 (hereby incorporated by reference in their entirety) disclose methods for making aqueous alcoholic dispersions. After the dispersion is made, the FSA concentration and the dispersing liquid composition can be adjusted by methods known in the art.

Aqueous dispersions comprising colloid-forming polymeric acids, including FSA polymers, typically have particle sizes as small as possible, so long as a stable colloid is formed. Aqueous dispersions of FSA polymer are available commercially as Nafion® dispersions, from E. I. du Pont de Nemours and Company (Wilmington, Del.). An example of a suitable FSA polymer comprises a copolymer having a structure:

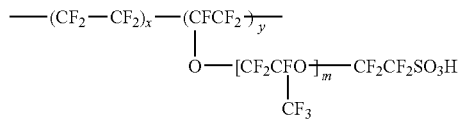

The copolymer comprises tetrafluoroethylene and perfluoro (4-methyl-3,6-dioxa-7-octene-1-sulfonic acid) wherein m=1.

Aqueous dispersions of FSA polymer from US2004/0121210 A1 or US2005/0037265 A1 could be made by using the methods disclosed in U.S. Pat. No. 6,150,426; the disclosure of the previously identified U.S. patents and patent applications is hereby incorporated by reference in their entirety.

Other suitable FSA polymers are disclosed in U.S. Pat. No. 5,422,411; hereby incorporated by reference in its entirety. One such suitable polymeric acid that can be used as counter ion/dispersant for polythiophenes can have the following structure:

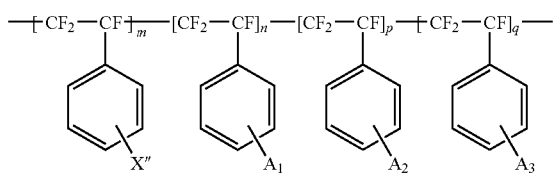

where at least two of m, n, p and q are integers greater than zero; A$_1$, A$_2$, and A$_3$ are selected from the group consisting of alkyls, halogens, C$_y$F$_{2y+1}$ where y is an integer greater than zero, O—R" (where R" is selected from the group consisting of alkyl, perfluoroalkyl and aryl moieties), CF=CF$_2$, CN, NO$_2$ and OH; and X" is selected from the group consisting of SO$_3$H, PO$_2$H$_2$, PO$_3$H$_2$, CH$_2$PO$_3$H$_2$, COOH, OPO$_3$H$_2$, OSO$_3$H, OArSO$_3$H where Ar is an aromatic moiety, NR"$_3^+$ (where R" is selected from the group consisting of alkyl, perfluoroalkyl and aryl moieties), and CH$_2$NR$_3^+$ (where R" is selected from the group consisting of alkyl, perfluoroalkyl and aryl moeities). The A$_1$, A$_2$, A$_3$ and X" substituents may be located in the ortho, meta and/or para positions. The copolymer may also be binary, ternary or quaternary.

While any suitable non-fluorinated polymeric acid may be employed, examples of such acids comprise at least one member selected from the group consisting of poly(styrenesulfonic acid) and poly(2-acrylamido-2-methyl-1-propanesulfonic acid). The amount of non-fluorinated polymer acid typically ranges from about 0.05 wt. % to about 1.5 wt. % of the dispersion.

In one embodiment, thienothiophene or the thieno[3,4-b]thiophene monomers are oxidatively polymerized in an aqueous medium comprising at least one ether containing polymer and polymeric acid colloids. Typically, the thienothiophene or thieno[3,4-b]thiophene monomers are combined with or added to an aqueous dispersion comprising at least one polymerization catalyst, at least one oxidizing agent, and colloidal polymeric acid particles. In this embodiment, the order of combination or addition may vary provided that the oxidizer and catalyst is typically not combined with the monomer until one is ready for the polymerization reaction to proceed. Polymerization catalysts include, without limitation, at least one member selected from the group consisting of ferric sulfate, ferric chloride, cerium sulfate, and the like and mixtures thereof. Oxidizing agents include, without limitation, at least one member selected from the group consisting of ferric sulfate, ferric chloride, sodium persulfate, potassium persulfate, ammonium persulfate, and the like, including combinations thereof. In some cases, the oxidant and catalyst can comprise the same compound. The oxidative polymerization results in a stable, aqueous dispersion comprising positively charged conducting polymeric thienothiophene and/or thieno [3,4-b]thiophene that is charge balanced by the negatively charged side chains of the polymeric acids contained within the colloids (e.g., sulfonate anion, carboxylate anion, acetylate anion, phosphonate anion, combinations, and the like). While any suitable process conditions can be employed for polymerizing the thienothiophene, using the temperature ranges from about 8 to about 95° C. as well as conditions and equipment sufficient to obtain, mix and maintain a dispersion are useful.

In one embodiment of the invention, a method of making an aqueous dispersions comprising poly(thieno[3,4-b] thiophene), at least one ether containing polymer and at least one colloid-forming polymer acid comprises: (a) providing an aqueous dispersion comprising at least one ether containing polymer, at least one fluorinated polymer acid and at least one non-fluorinated polymeric acid; (b) adding at least one oxidizer to the dispersion of step (a); (c) adding at least one catalyst or oxidizer to the dispersion of step (b); (d) adding thieno[3,4-b]thiophene monomer to the dispersion of step (c), (e) permitting the monomer dispersion to polymerize, and (f) adjusting the pH of the dispersion to a value sufficiently high to render the material resistivity more stable. The method may include adjusting the pH to a value greater than 3. In another embodiment, the pH value may be adjusted to greater than 6 or greater than 8. One alternative embodiment to this method comprises adding thieno[3,4-b]thiophene monomer to the aqueous dispersion of at least one ether containing polymer and at least one polymeric acid prior to adding the oxidizer. Another embodiment, comprises forming an aqueous dispersion comprising water and thieno[3,4-b]thiophene (e.g., of any number of thieno[3,4-b]thiophene concentrations in water which is typically in the range of about 0.05% by weight to about 50% by weight thieno[3,4-b]thiophene), and add this thieno[3,4-b]thiophene mixture to the aqueous dispersion of the polymeric acid before or after adding the oxidizer and catalyst. In yet another embodiment, thienothiophene monomer is dissolved in an organic solvent that is compatible with water, and the dissolved monomer solution is added to the aqueous dispersion of polymeric acid before or after adding the oxidizer and/or catalyst.

The compositions of the present invention are not limited to the homopolymeric structures above and may include heteropolymeric or copolymeric structures. The copolymeric structures may be any combination of alternating copolymers (e.g., alternating A and B units), periodic copolymers (e.g., (A-B-A-B-B-A-A-A-A-B-B-B)n, random copolymers (e.g., random sequences of monomer A and B), statistical copolymers (e.g., polymer sequence obeying statistical rules) and/or block copolymers (e.g., two or more homopolymer subunits linked by covalent bonds). The copolymers may be branched or linked, provided the resultant copolymer maintains the properties of electrical conductivity. The copolymer structures may be formed from monomeric, oligomeric or polymeric compounds. For example, monomers suitable for use in the copolymer system may include monomers such as thiophene, substituted thiophenes, substituted thieno[3,4-b]thiophenes, dithieno[3,4-b:3',4'-d]thiophene, pyrrole, bithiophene, substituted pyrroles, phenylene, substituted phenylenes, naphthalene, substituted naphthalenes, biphenyl and terphenyl, substituted terphenyl, phenylene vinylene and substituted phenylene vinylene.

In addition to thienothiophene or the thieno[3,4-b] thiophene monomers, other thiophene monomeric compounds may be utilized in the present invention, provided that the resultant polymer is electrically conductive and includes both fluorinated polymeric acid and non-fluorinated polymeric acid.

In some cases, the dispersion can include at least one metal (e.g., at least one ion). Examples of metals that can be added or present in the dispersion comprise at least one member selected from the group consisting of $Fe^{2+}$, $Fe^{3+}$, $K^+$, and $Na^+$., mixtures thereof, among others. The oxidizer:monomer molar ratio is usually about 0.05 to about 10, generally in the range of about 0.5 to about 5. (e.g., during the inventive polymerization steps). If desired, the amount of metal can be lowered or removed by exposing the dispersion to cationic and ionic exchange resins.

The thiophene monomer polymerization can be carried out in the presence of co-dispersing carriers or liquids which are normally miscible with water. Examples of suitable co-dispersing liquids comprise at least one member selected from the group consisting of ethers, alcohols, esters, cyclic ethers, ketones, nitrites, sulfoxides, amide, acetamide, and combinations thereof. In one embodiment, the amount of co-dispersing liquid is less than about 30% by volume. In one embodiment, the amount of co-dispersing liquid is less than about 60% by volume. In one embodiment, the amount of co-dispersing liquid is between about 5% to about 50% by volume. In one embodiment, the co-dispersing liquid comprises at least one alcohol. In one embodiment, the co-dispersing carrier or liquid comprises at least one member selected from the group of n-propanol, isopropanol, t-butanol, methanol, dimethylacetamide, dimethylformamide, N-methylpyrrolidone, and propylene glycol n-propylether. The co-dispersing liquid can comprise an organic acid such as at least one member selected from the group consisting of p-toluenesulfonic acid, dodecylbenzenesulfonic acid, methanesulfonic acid, trifluoromethanesulfonic acid, camphorsulfonic acid, acetic acid, mixtures thereof and the like. Alternatively, the acid can comprise a water soluble polymeric acid such as poly(styrenesulfonic acid), poly(2-acrylamido-2-methyl-1-propanesulfonic acid), or the like, or a second colloid-forming acid, as described above. Combinations of acids can also be used.

The organic acid can be added to the polymerization mixture at any point in the process prior to the addition of either the oxidizer or the thienothiophene monomer, whichever is added last. In one embodiment, the organic acid is added before both the thiophene monomer, at least one ether containing polymer and the optional colloid-forming polymeric acid, and the oxidizer is added last. In one embodiment the organic acid is added prior to the addition of the thiophene monomer, followed by the addition of the colloid-forming polymeric acid, and the oxidizer is added last. In another embodiment, the polymeric co-acid can be added to the aqueous dispersion after the as-synthesized aqueous dispersion has been treated with ion exchange resin(s). The co-dispersing liquid can be added to the polymerization mixture at any point prior to the addition of the oxidizer, catalyst, or monomer, whichever is last.

In another aspect of the invention, after completing any of the methods described above and completion of the polymerization, the as-synthesized aqueous dispersion is contacted with at least one ion exchange resin under conditions suitable to produce a stable, aqueous dispersion. In one embodiment, the as-synthesized aqueous dispersion is contacted with a first ion exchange resin and a second ion exchange resin. In another embodiment, the first ion exchange resin comprises an acidic, cation exchange resin, such as a sulfonic acid cation exchange resin set forth above, and the second ion exchange resin comprises a basic, anion exchange resin, such as a tertiary amine or a quaternary exchange resin.

Ion exchange comprises a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins can be employed in the present invention. In one embodiment, the acidic, cation exchange resin comprises an organic acid, cation exchange resin, such as a sulfonic acid cation exchange resin. Sulfonic acid cation exchange resins contemplated for use in the practice of the invention can comprise at least one member selected from the group consisting of sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin comprises at least one organic acid, cation exchange resin, such as carboxylic acid, acrylic or phosphoric acid cation exchange resin and mixtures thereof. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, tetra-methylammonium hydroxide, calcium hydroxide, cesium hydroxide, and mixtures thereof, among others.

In another embodiment, the basic, anionic exchange resin comprises at least one tertiary amine anion exchange resin. Tertiary amine anion exchange resins contemplated for use in the practice of the invention can comprise at least one member selected from the group consisting of tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin comprises at least one quaternary amine anion exchange resin, or mixtures of these and among other exchange resins.

The first and second ion exchange resins may contact the as-synthesized aqueous dispersion either simultaneously, or consecutively. For example, in one embodiment both resins are added simultaneously to an as-synthesized aqueous dispersion comprising an electrically conducting polymer, and allowed to remain in contact with the dispersion for at least about 1 hour, e.g., about 2 hours to about 20 hours. The ion exchange resins can then be removed from the dispersion by filtration. This procedure can be repeated as desired in order to achieve a given ion concentration. The size of the filter is chosen so that the relatively large ion exchange resin particles will be removed while the smaller dispersion particles will pass through. Without wishing to be bound by theory or explanation, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins increases the pH of the dispersion. Generally, around 1-2 g of ion exchange resin per milli-equivalent oxidant is used to remove the oxidant. In one embodiment, 5-10 g of ion exchange resin is used per 1 g of $Fe_2(SO_4)_3 \cdot *H_2O$. In general, at least 1 gram of ion exchange resin is used per about 1 gram of colloid-forming polymeric acid. In one embodiment, about one gram of Lewatit® MP62 WS, a weakly basic anion exchange resin from Bayer GmbH, and about one gram of Lewatit® Mono-Plus S100, a strongly acidic, acid cation exchange resin from Bayer, GmbH, are used per gram of the composition of poly (thieno[3,4-b]thiophene) and at least one colloid-forming polymeric acid.

In one aspect of the invention, the dispersion further comprises a relatively low weight percentage of highly conductive additives, can be used, as desired, to reach the percolation threshold. Examples of suitable conductive additives can comprise at least one member selected from the group consisting of metal particles and nanoparticles, nanowires, carbon nanotubes, graphite fiber or particles, carbon particles and combinations thereof.

In one embodiment of the invention, the cast thin film or layer of the hole injection layer is annealed typically at elevated temperatures (e.g., up to about 250° C.). By "annealing" it is meant that the film is treated under conditions necessary to impart desired properties for targeted applications, such as removal of residual solvent or moistures.

In a further aspect of the invention additional materials may be added. Examples of additional water soluble or dispersible materials which can be added include, but are not limited to polymers, dyes, coating aids, carbon nanotubes, nanowires, surfactants (e.g., fluorosurfactants such as Zonyl® FSO series non-ionic fluorosurfactants (e.g., available commercially from DuPont, Wilmington, Del.) with structure $R_f CH_2 CH_2 O(CH_2 CH_2 O)_x H$, where $R_f = F(CF_2 CF_2)_y$, x=0 to about 15 and y=1 to about 7, acetylenic diol based surfactants such as Dynol™ and Surfynol® series (e.g., available commercially from Air Products and Chemicals, Inc., Allentown, Pa.), organic and inorganic conductive inks and pastes, charge transport materials, crosslinking agents, and combinations thereof. The materials can be simple molecules or polymers. Examples of suitable other water soluble or dispersible polymers comprise at least one conductive polymer such as polyanilines, polyamines, polypyrroles, polyacetylenes, and combinations thereof.

In another embodiment, the invention relates to electronic devices comprising at least one electroactive layer (usually a semiconductor conjugated small molecule or polymer) positioned between two electrical contact layers, wherein at least one of the layers of the device includes the inventive hole injection layer. One embodiment of the present invention is illustrated by an OLED device, as shown in FIG. 1. Referring now to FIG. 1, FIG. 1 illustrates a device that comprises an anode layer 110, a hole injection layer (HIL) 120, an electroluminescent layer (EL or EML) 130, and a cathode layer 150. Adjacent to the cathode layer 150 is an optional electron-injection/transport layer 140. Between the hole injection layer 120 and the cathode layer 150 (or optional electron injection/transport layer 140) is the electroluminescent layer 130. Alternatively, a layer of hole transport and/or electron blocking layer, commonly termed interlayer, can be inserted between the hole injection layer 120 and the electroluminescent layer 130. An example of the benefit of using polymeric interlayer in between HIL and EML was to improve the device lifetime as well as the device efficiency. Without wishing to be bound by any theory or explanation, it is believed that the polymer interlayer may prevent the exciton quenching at HIL interface by acting as an efficient exciton blocking layer and the recombination zone is confined near the interlayer/emitting layer interface. Since, in some cases, the polymer interlayer can be dissolved by the solvents of the EML (e.g., so that the intermixing of the interlayer with the EML may occur), it may be desirable to harden/crosslinking the layer by thermal annealing above the glass transition temperature (Tg).

In another embodiment of the invention, the dispersion further comprises additives which can comprise organic liquids that are commonly characterized as solvents/humectants. While any suitable additive can be employed, examples of suitable additives comprise at least one member selected from the group consisting of:
  (1) alcohols, such as methyl alcohol, ethyl alcohol, n-propyl alcohol, isopropyl alcohol, n-butyl alcohol, sec-butyl alcohol, t-butyl alcohol, iso-butyl alcohol, furfuryl alcohol, and tetrahydrofurfuryl alcohol;
  (2) polyhydric alcohols, such as ethylene glycol, diethylene glycol, triethylene glycol, tetraethylene glycol, propylene glycol, polyethylene glycol, glycerol, 2-methyl-2,4-pentanediol, 1,2,6-hexanetriol, 2-ethyl-2-hydroxymethyl-1,3-propanediol, 1,5 pentanediol, 1,2-hexanediol, and thioglycol;
  (3) lower mono- and di-alkyl ethers derived from the polyhydric alcohols;
  (4) nitrogen-containing compounds such as 2-pyrrolidone, N-methyl-2-pyrrolidone, and 1,3-dimethyl-2-imidazolidinone;
  (5) sulfur-containing compounds such as 2,2'-thiodiethanol, dimethyl sulfoxide and tetramethylene sulfone; and
  (6) Ketones, ethers and esters.

Examples of polyhydric alcohols (e.g., which are suitable for use a film forming additive) can comprise at least one member selected from the group consisting of ethylene glycol, diethylene glycol (DEG), triethylene glycol, propylene glycol, tetraethylene glycol, polyethylene glycol, glycerol, 2-methyl-2,4-pentanediol, 2-ethyl-2-hydroxymethyl-1,3-propanediol (EHMP), 1,5 pentanediol, 1,2-hexanediol, 1,2, 6-hexanetriol and thioglycol. Examples of lower alkyl mono- or di-ethers derived from polyhydric alcohols can comprise at least one member selected from the group consisting of ethylene glycol mono-methyl or mono-ethyl ether, diethylene glycol mono-methyl or mono-ethyl ether, propylene glycol mono-methyl, mono-ethyl and propyl ether, triethylene glycol mono-methyl, mono-ethyl or mono-butyl ether (TEG-MBE), diethylene glycol di-methyl or di-ethyl ether, poly (ethylene glycol) monobutyl ether (PEGMBE), diethylene glycol monobutylether (DEGMBE) and propylene glycol methyl ether acetate. Commercial examples of such compounds include Dow P-series and E-series glycol ethers in the Carbitol™ and Dowanol® product family, available from Dow Chemical Company, Midland, Mich.

Examples of ketones or ketoalcohols suitable for use as an additive (e.g., a film forming additive) comprise at least one member selected from the group consisting of methyl ethyl ketone and diacetone alcohol. Examples of ethers comprise at least one of tetrahydrofuran and dioxane, and examples of esters comprise at least one of ethyl lactate, ethylene carbonate and propylene carbonate.

Film forming additives useful for the current invention may also include at least one surfactant. The surfactants may be anionic, cationic, amphoteric or nonionic and used at levels of about 0.005 to about 2% of the inventive dispersion (e.g., an ink composition). Examples of useful surfactants can comprise those disclosed in U.S. Pat. Nos. 5,324,349; 4,156,616 and 5,279,654, which are herein incorporated by reference in their entirety, as well as many other surfactants. Commercial surfactants include the Surfynols™, Dynol™ from Air Products and Chemicals, Inc., Allentown, Pa.; Zonyls™ surfactants rom DuPont and Fluorads™ surfactants (now Novec™) from 3M. Examples of silicon surfactants are available from BYK-Chemie as BYK surfactants, and from Crompton Corp, as Silwet™ surfactants. Commercially available fluorinated surfactants can comprise Zonyls™ surfactants from DuPont and the Fluorads™ (now Novec™) surfactants from 3M; which can be used alone or in combination with other surfactants.

Combinations of film forming additives may also be utilized. Film forming additives can be selected (e.g., viscosity modifier, surface tension modifier, among others) in order to provide desirable film forming properties. This can permit dispersions of the instant invention to be employed by electronic device manufacturers in a broad range of applications, including light emitting display, solid state lighting, photovoltaic cells and thin film transistors.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support (e.g., a flexible organic film comprising poly (ethylene terephthalate), poly(ethylene naphthalene-2.6,-dicarboxylate), and polysulfone). The anode layer 110 comprises an electrode that is more efficient for injecting holes compared to the cathode layer 150. The anode can comprise materials containing a metal, mixed metal, alloy, metal oxide or mixed oxide. Suitable materials comprise at last one member selected from the group consisting of mixed oxides of the Group 2 elements (e.g., Be, Mg, Ca, Sr, Ba, Ra), the Group 11 elements, the elements in Groups 4, 5, and 6, and the Group 8-10 transition elements (The IUPAC number system is used throughout, where the groups from the Periodic Table are numbered from left to right as 1-18 [CRC Handbook of Chemistry and Physics, 81$^{st}$ Edition, 2000]). If the anode layer 110 is light transmitting, then mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, comprise at least one member selected from the group consisting of indium-tin-oxide ("ITO"), aluminum-tin-oxide, doped zinc oxide, gold, silver, copper, and nickel. The anode may also comprise a conductive organic material such as polyaniline, polythiophene or polypyrrole.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include RF magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

Hole injection layer 120 includes a film formed by using the dispersion of the present invention. The hole injection layer 120 is usually cast onto substrates using a variety of techniques well-known to those skilled in the art. Typical casting techniques include, for example, solution casting, drop casting, curtain casting, spin-coating, screen printing, inkjet printing, gravure printing, spray coating, among others. When the hole injection layer is applied by spin coating, the viscosity and solid contents of the dispersion, and the spin rate can be employed to adjust the resultant film thickness. Films applied by spin coating are generally continuous and without pattern. Alternatively, the hole injection layer can be patterned using a number of depositing processes, such as ink jet printing such as described in U.S. Pat. No. 6,087,196; hereby incorporated by reference in its entirety.

The electroluminescent (EL) layer 130 may typically be a conjugated polymer, such as poly(paraphenylenevinylene), abbreviated as PPV, polyfluorene, spiropolyfluorene or other EL polymer material. The EL layer can also comprise relatively small molecules fluorescent or phosphorescent dye such as 8-hydroxyquinoline aluminum ($Alq_3$) and tris(2-(4-tolyl)phenylpyridine) Iridium (III), a dendrimer, a blend that contains the above-mentioned materials, and combinations. The EL layer can also comprise inorganic quantum dots or blends of semiconducting organic material with inorganic quantum dots. The particular material chosen may depend on the specific application, potentials used during operation, or other factors. The EL layer 130 containing the electroluminescent organic material can be applied from solutions by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. That is, layer 140 may promote electron mobility and reduce the likelihood of a quenching reaction that can occur when layers 130 and 150 are in direct contact. Examples of materials for optional layer 140 comprise at least one member selected from the group consisting of metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, CaO, LiF, CsF, NaCl, $Li_2O$, mixtures thereof, among others.

The cathode layer 150 comprises an electrode that is particularly efficient for injecting electrons or negative charge carriers. The cathode layer 150 can comprise any suitable metal or nonmetal having a lower work function than the first electrical contact layer (in this case, the anode layer 110). As used herein, the term "lower work function" is intended to mean a material having a work function no greater than 4.4 eV. As used herein, "higher work function" is intended to mean a material having a work function of at least 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 comprise at least one member selected from the group consisting of calcium, barium, lithium, cerium, cesium, europium, rubidium, yttrium, magnesium, samarium, and alloys and combinations thereof. When a reactive low work function metal such as Ca, Ba or Li is used, an overcoat of a more inert metal, such as silver or aluminum, can be used to protect the reactive metal and lower the cathode resistance.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view). For top emitting devices, a very thin layer of low work function metal such as Ca and Ba combined with a thicker layer transparent conductor such as ITO can be used as transparent cathode. Top emitting devices are beneficial in active matrix display because larger aperture ratio can be realized. Examples of such devices are described in "Integration of Organic LED's and Amorphous Si TFT's onto Flexible and Lightweight Metal Foil Substrates"; by C. C. Wu et al; IEEE Electron Device Letters, Vol. 18, No. 12, December 1997, hereby incorporated by reference in its entirety.

In other embodiments, additional layer(s) may be present within organic electronic devices. For example, a layer (not shown) between the hole injection layer 120 and the EL layer 130 may facilitate positive charge transport, energy-level matching of the layers, function as a protective layer, among other functions. Similarly, additional layers (not shown) between the EL layer 130 and the cathode layer 150 may facilitate negative charge transport, energy-level matching between the layers, function as a protective layer, among other functions. Layers that are known in the art can be also be included. In addition, any of the above-described layers can be made of two or more layers. Alternatively, some or all of inorganic anode layer 110, the hole injection layer 120, the EL layer 130, and cathode layer 150, may be surface treated to increase charge carrier transport efficiency. The choice of materials for each of the component layers may be determined by balancing the goals of providing a device with high device efficiency and longer device lifetime with the cost of manufacturing, manufacturing complexities, or potentially other factors.

The different layers may have any suitable thickness. Inorganic anode layer 110 is usually no greater than approximately 500 nm, for example, approximately 10-200 nm; hole injection layer 120, is usually no greater than approximately 300 nm, for example, approximately 30-200 nm; EL layer 130, is usually no greater than approximately 1000 nm, for example, approximately 30-500 nm; optional layer 140 is usually no greater than approximately 100 nm, for example, approximately 20-80 nm; and cathode layer 150 is usually no greater than approximately 300 nm, for example, approximately 1-150 nm. If the anode layer 110 or the cathode layer 150 needs to transmit at least some light, the thickness of such layer may not exceed approximately 150 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or photovoltaic cells). The light-emitting materials may be dispersed in a matrix of another material, with or without additives, and may form a layer alone. The EL layer 130 generally has a thickness in the range of approximately 30-500 nm.

Examples of other organic electronic devices that may benefit from having one or more layers comprising the aqueous dispersion of the instant invention comprise: (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

Organic light emitting diodes (OLEDs) inject electrons and holes from the cathode 150 and anode 110 layers, respectively, into the EL layer 130, and form negative and positively charged polarons in the polymer. These polarons migrate under the influence of the applied electric field, forming an exciton with an oppositely charged polarons and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s), not shown, may be electrically connected to the electronic device as part of a circuit.

The fabrication of full-color or area-color displays using two or more different light-emitting materials becomes complicated if each light-emitting material employs a different cathode material to optimize its performance. Display devices typically comprise a multiplicity of pixels which emit light. In multicolor devices, at least two different types of pixels (sometimes referred to as sub-pixels) are emitting light of different colors. The sub-pixels are constructed with different light-emitting materials. It is desirable to have a single cathode material that gives good device performance with all of the light emitters. This minimizes the complexity of the device fabrication. It has been found that a common cathode can be used in multicolor devices where the hole injection layer is made from the inventive aqueous dispersion. The cathode can be made from any of the materials discussed above; and may be barium, overcoated with a more inert metal such as silver or aluminum.

Other organic electronic devices that may benefit from having one or more layers comprising an aqueous dispersion of conductive polymer, including poly(thieno[3,4-b]thiophene), and at least one colloid-forming polymeric acid and at least one non-fluorinated polymeric acid include: (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

If desired, the hole injection layer can be overcoated with a layer of conductive polymer applied from aqueous solution or solvent. The conductive polymer can facilitate charge transfer and also improve coatability. Examples of suitable conductive polymers comprise at least one member selected from the group consisting of polyanilines, polythiophenes, polypyrroles, polyacetylenes, polythienothiophene/polystyrenesulfonic acid, polydioxythiophene/polystyrenesulfonic acid, polyaniline-polymeric-acid-colloids, PEDOT-polymeric-acid-colloids and combinations thereof.

In yet another embodiment, the invention relates to thin film field effect transistors comprising electrodes obtained from the inventive dispersion. For use as electrodes in thin film field effect transistors, the conducting polymers and the liquids for dispersing or dissolving the conducting polymers are compatible with the semiconducting polymers and the solvents (e.g., to prevent re-dissolution of the polymers or semiconducting polymers). Thin film field effect transistor electrodes fabricated from conducting polymers should have a conductivity greater than about 10 S/cm. However, electrically conducting polymers made with water soluble polymeric acids usually provide conductivity in the range of about $10^{-3}$ S/cm or lower. Thus, in one embodiment of the invention, the electrodes comprise at least one polythiophene, at least one ether containing polymer and optionally fluorinated colloid-forming polymeric sulfonic acids in combination with electrical conductivity enhancers such as nanowires, carbon nanotubes, among others. In still another embodiment of the invention, the electrodes comprise poly(thieno[3,4-b]thiophene), at least one ether containing polymer and colloid-forming perfluoroethylenesulfonic acid in combination with electrical conductivity enhancers such as nanowires, carbon nanotubes, among others. Inventive compositions may be used in thin film field effect transistors as gate electrodes, drain electrodes, or source electrodes.

In organic thin film transistor (OTFT) devices, charge injection from source electrode to the channel material can be limited due to the mismatch of the work function of the electrode and the energy level of the channel material, which results in a significant voltage drop at the contact between the electrode and the channel material. As a result, apparent charge mobility becomes low, and the OTFT device can only pass low current. Similar to the application as hole injection layer in OLED, a thin layer of the inventive conductive polymer film can be applied between the source or drain electrode and the channel material of an OTFT device, to improve the energy level match, reduce the contact voltage drop and improve charge injection. As a result, higher current and higher charge mobility can be achieved in the OTFT device.

The invention will now be described in greater detail by reference to the following non-limiting examples. The following examples described certain embodiments of the present invention and shall not limit the scope of the claims appended hereto.

EXAMPLES

The invention and its advantages are further illustrated by the following specific examples.

Example A

Synthesis of Polymers

Polymer 12 (Sulfonated PEEK: s-PEEK)

Polymer PEEK (Vitrex PEEK 150XF) (30 g) was dissolved in 300 mL of concentrated sulfuric acid at 50° C. The reaction was stirred at room temperature under nitrogen for 10 days. Polymer was precipitated into ice cold water. Polymer was collected by filtration, washed thoroughly with water. Polymer was then dissolved in methanol and equal volume of water was added. Methanol was removed under reduced pressure. Ionic impurities were removed by ion exchange resins IR-120 and MP-62 to yield clear aqueous solution.

The degree of sulfonation was determined by $^1$H and $^{13}$C NMR to be 88%. The solution was analyzed for residual metal ions by Inductively Coupled Plasma Mass Spectrometry (ICP-MS) with the following ions being detected: Al (<1 ppm); Ba (<1 ppm); Ca (23 ppm); Cr (<1 ppm), Fe (<8 ppm); Mg (<1 ppm); Mn (<1 ppm); Ni (<1 ppm); Zn (<1 ppm); Na (<=6 ppm); K (<1 ppm). Residual anion was analyzed by ion chromatography (IC) to be below 1 ppm for the anions detected, chloride, sulfate, nitrate, fluoride.

Polymer 6 (sulfonated poly(hydroxyphenylphthalazinon-eether ketone): s-PPPEK)

Poly(hydroxyphenylphthalazinone ether ketone) PPPEK) was synthesized by reaction between 4,4'-difluorobenzophe-none and 1-hydroxy-4-hydroxyphenylphthalazine in the presence of base in dimethylacetamide at high temperature (Hay, A. S. U.S. Pat. No. 5,237,062; hereby incorporated by reference). Polymer 6 was synthesized via the same procedure as polymer 12. After precipitation, polymer was washed thoroughly with warm water. Polymer was then dissolved in hot water at about 8% solid and purified by ion exchange resins IR-120 and MP-62. The solution was analyzed for residual metal ions by Inductively Coupled Plasma Mass Spectrometry (ICP-MS) with the following ions being detected: Al (<2 ppm); Ba (<9 ppm); Ca (<3 ppm); Cr (<0.3 ppm), Fe (<1 ppm); Mg (2 ppm); Mn (<0.3 ppm); Ni (<0.2 ppm); Zn (<2 ppm); Na (32 ppm); K (7 ppm). Residual anion was analyzed by ion chromatography (IC) with the following anion being detected: chloride (1.7 ppm), sulfate (3.2 ppm).
Polymer 26 (Sulfonated poly(phenylene Oxide): s-PPO)

A three-neck round bottom flask was equipped with a nitrogen inlet, a mechanical stirrer, and a pressure equalized additional funnel. To the flask was added poly(phenylene oxide) (purchased from Aldrich, Mw 244,000, Mn 32,000) (36 g, 0.3 mol of repeating unit) and 360 mL of anhydrous 1,2-dichloroethane. To the additional funnel was added chlorosulfonic acid (38.4 g, 0.33 mol) in 230 mL of dichloroethane. After the polymer dissolved in dichloroethane in the flask, chlorosulonic acid solution was added dropped wise under vigorous stirring. Light brown precipitate formed. The reaction was stirred at room temperature for additional 4 hours after the addition of chlorosulfonic acid. The precipitated polymer was filtered, washed thoroughly with dichloroethane and air dried. The polymer was then dissolved in methanol and equal volume of water was added. Methanol was removed under reduced pressure. The resulting clear aqueous solution was purified by ion exchange resins IR-120 and MP-62 to remove ionic impurities to yield a solution at 5.3% solid.

The degree of sulfonation was determined by $^1$H and $^{13}$C NMR to be 88%. The solution was analyzed for residual metal ions by Inductively Coupled Plasma Mass Spectrometry (ICP-MS) with the following ions being detected: Al (<1 ppm); Ba (<1 ppm); Ca (15 ppm); Cr (<1 ppm), Fe (<3 ppm); Mg (8 ppm); Mn (<1 ppm); Ni (<1 ppm); Zn (<2 ppm); Na (26 ppm); K (3 ppm). Residual anion was analyzed by ion chromatography (IC) with the following anion being detected: chloride (2.1 ppm), sulfate (6.8 ppm).
Polymer 30 (Sulfonated Polysulfone: s-PSU)

Polymer 30 was synthesized via the same procedure as polymer 26. Polysulfone (purchased from Aldrich, Mw 35,000, Mn 16,000) (20 g, 0.045 mol of repeating unit) in 200 mL of anhydrous 1,2-dichloroethane reacted with chlorosulfonic acid (5.8 g, 0.05 mol) in 65 mL of dichloroethane. After purification by ion exchange resins IR-120 and MP-62, the polymer was obtained as clear aqueous solution.

The degree of sulfonation was determined by $^1$H and $^{13}$C NMR to be 90%. The solution was analyzed for residual metal ions by Inductively Coupled Plasma Mass Spectrometry (ICP-MS) with the following ions being detected: Al (<3 ppm); Ba (<3 ppm); Ca (<=6 ppm); Cr (<3 ppm), Fe (<2 ppm); Mg (<2 ppm); Mn (<4 ppm); Ni (<2 ppm); Zn (<2 ppm); Na (<=4 ppm); K (2 ppm). Residual anion was analyzed by ion chromatography (IC) with the following anion being detected: chloride (1.2 ppm), sulfate (1.9 ppm).
Polymer 32a (x=1, y=0) (Sulfonated Fluorinated polysulfone: s-F-PSU)

A round bottom flask was equipped with a Dean-Stark trap and a magnetic stirring bar. To the flask was added 4,4'-(hexafluoroisopropylidene)diphenol (purchased from Aldrich) (14.67 g, 0.044 mol), 3,3'-disulfonated-4,4'-difluorophenyl sulfone, disodium salt (purchased from Prime Organics, Inc) (20.0 g, 0.044 mol), potassium carbonate (15.07 g, 0.11 mol), 80 mL toluene and 80 mL of dimethyl acetamide. The reaction was heated to 140° C. for 4 hours to remove water. The temperature was raised to 170° C., and the reaction was heated overnight. Total reaction time was 18 hours. The reaction was cooled to room temperature and the polymer was precipitated into acetone. The polymer was collected by filtration and washed with acetone and air dried. The light beige polymer was dissolved in water and purified by ion exchange resins IR-120 and MP-62 to yield clear aqueous polymer solution.

The solution was analyzed for residual metal ions by Inductively Coupled Plasma Mass Spectrometry (ICP-MS) with the following ions being detected: Al (<2 ppm); Ba (<3 ppm); Ca (<3 ppm); Cr (<0.3 ppm), Fe (<1 ppm); Mg (0.8 ppm); Mn (<0.3 ppm); Ni (<0.6 ppm); Zn (<2 ppm); Na (70 ppm); K (4 ppm). Residual anion was analyzed by ion chromatography (IC) with the following anion being detected: chloride (0.68 ppm), sulfate (0.43 ppm).
Polymer 32b (x=y=0.5) (s-50F-PSU)

Polymer 32b was synthesized via the same procedure as polymer 32a. Bis(4-fluorophenyl) sulfone (purchased from Aldrich) (11.34 g, 0.045 mol) and 3,3'-disulfonated-4,4'-difluorophenyl sulfone, disodium salt (purchased from Prime Organics, Inc) (20.45 g, 0.045 mol), reacted with 4,4'-(hexafluoroisopropylidene)diphenol (purchased from Aldrich) (30.0 g, 0.089 mol), in the presence of potassium carbonate (24.66 g, 0.18 mol), 120 mL toluene and 120 mL of dimethyl acetamide. Polymer was precipitated into acetone and filtered. After drying under vacuum, the polymer was suspended in water and filtered. The polymer was then dissolved in 1/1 methanol/water, and methanol was removed under reduced pressure. The polymer was purified by ion exchange resins IR-120 and MP-62 to yield clear aqueous polymer solution.

The solution was analyzed for residual metal ions by Inductively Coupled Plasma Mass Spectrometry (ICP-MS) with the following ions being detected: Al (<2 ppm); Ba (<4 ppm); Ca (<3 ppm); Cr (<0.3 ppm), Fe (<1 ppm); Mg (0.9 ppm); Mn (<0.3 ppm); Ni (<0.6 ppm); Zn (<2 ppm); Na (22 ppm); K (31 ppm). Residual anion was analyzed by ion chromatography (IC) with the following anion being detected: chloride (0.1 ppm), sulfate (0.45 ppm).

Example B

Synthesis of Conductive Polymer Dispersions

A general procedure was utilized to synthesize conductive polymer dispersions.

In all examples, 3,4-Ethylenedioxythiophene (EDOT) or thieno[3,4-b]thiophene (TT) was used as monomer for synthesis of conductive polymer dispersion. To a round bottom flask was added desired amount of EDOT, water, and polymer solution. The mixture was stirred for 5 minutes. To a separate bottle was added ferric sulfate and water. To another separate bottle was added sodium persulfate and water if sodium persulfate was present in the polymerization. Aqueous ferric sulfate solution was then added to the EDOT/polymer mixture under vigorous stirring, followed by addition of persulfate solution if applicable. The polymerization was carried out at room temperature for designated amount of time and stopped by adding ion exchange resin (IEX). After removal of resin by filtration, the dark dispersion was sonicated if necessary and then filtered through 0.45 micron PVDF filter. The polymerization results are summarized in Tables 1-3.

Resistivity Test

The resistivity of conductive polymer films cast from the dispersions were measured using ITO interdigitated electrodes on glass substrates. The effective electrode length was 15 cm and the gap between fingers was 20 micron. The dispersions were filtered with 0.45 micron hydrophilic PVDF filters and spin coated, at a spin rate of 1000 rpm for 1 min, onto the ITO interdigitated substrates for resistivity measurement. Before spin coating, the ITO substrates were cleaned with UV-ozone treatment on a UVOCZ equipment. The spin coated films were then transferred into a nitrogen filled glove box and measured for resistivity using a Keithley 2400 SourceMeter and a automatic switch that were interfaced with a computer using a LabVIEW program developed in house. Then the films were annealed on a hotplate at 180° C. for 15 min in the nitrogen filled glovebox, and the resistivities measured again.

Device Test

Patterned ITO substrates with surface resistance of 10-15 ohm/square (from Colorado Concept Coatings LLC) were used to fabricate PLED devices. The ITO substrates were cleaned by a combination of de-ionized water, detergent, methanol and acetone. Then the ITO substrates were cleaned with $O_2$ plasma in an SPI Prep II plasma etcher for about 10 min and ready for coating with a conductive polymer dispersion. All conductive polymer dispersions were filtered with a 0.45 micron PVDF hydrophilic filter before spin coating. The cleaned ITO substrate was spin coated with filtered conductive polymer dispersions to obtain a film thickness of around 50-100 nm. The spin length is programmed to be between 1 to 3 mins on a Laurell Model WS-400-N6PP spinner. A uniform film was obtained. The coated ITO substrates were then annealed at 180° C. for 15 min on a hotplate in a nitrogen filled glove box. After annealing, a layer comprising crosslinkable polyfluorene (supplied by Sumitomo Chemical Company) of about 10-20 nm thick interlayer polymer was spin-coated from toluene or xylene solution. The samples were then baked at 180 to 200° C. for 30-60 mins on a hotplate under $N_2$ protection. After that, a layer comprising polyfluorene of about 50-90 nm thick blue light emitting polymer (supplied by Sumitomo Chemical Company) was spin coated from toluene or xylene solution. The samples were then baked at 130° C. for 10 mins on a hotplate under $N_2$ protection. Alternatively, green PLED devices were fabricated. After the annealing of the conductive polymer layer, a layer comprising about 80-nm-thick LUMATION® Green 1304 polyfluorene LEP light emitting polymer (supplied by Sumitomo Chemical Company) of was spin coated from toluene solution. The samples were then baked at 130° C. for 20 min on a hotplate under $N_2$ protection. The samples were then transferred into the chamber of a vacuum evaporator, which was located inside an nitrogen atmosphere glove box. A layer of 5 nm thick Ba was vacuum deposited at below $1-2\times10^{-6}$ mBar through a mask at a rate of ~1.5 Å/s, and another layer of 120 nm thick Ag was vacuum deposited on top of the Ba layer at a deposition rate of ~3.0-4.0 Å/s thereby forming an LED device. The devices were then encapsulated with glass cover lid and UV curable epoxy in the nitrogen glove box. The active area of the device was about 6.2 $mm^2$. The LED device was then moved out of the glove box for testing in air at room temperature. Thickness was measured on a KLA Tencor P-15 Profiler. Current-voltage characteristics were measured on a Keithley 2400 SourceMeter. Electroluminescence (EL) spectrum of the device was measured using an Oriel InstaSpec IV CCD camera and is illustrated in FIG. 3 in U.S Patent Application US20060076557 A1, which is hereby incorporated by reference in its entirety. The power of EL emission was measured using a Newport 2835-C multi-function optical meter in conjunction with a calibrated Si photodiode. Brightness was calculated using the EL forward output power and the EL spectrum of the device, assuming Lambertian distribution of the EL emission, and verified with a Photo Research PR650 calorimeter. The lifetime of PLED devices was measured on an Elipse™ PLED Lifetime Tester (from Cambridge Display Technology) under constant current driving condition at room temperature. The driving current was set according to the current density needed to achieve the initial brightness measured using the Si photodiode. For the experiments in this Example, 3000 nits was employed as the initial device brightness for the blue PLED devices and 5000 nits for the green PLED devices and defined the life time of the device as the time takes for the brightness to reach 50% of the initial value. Since multiple devices were made using the same ink composition, the device performance data were reported as a range as shown in Table 5. These data included Driving voltage (volts) and current efficiency (Cd/A) at 3000 nits brightness, lifetime as $T_{50}$ (hrs) and the driving voltage increase during the lifetime testing as determined by % of voltage change from initial until $T_{50}$. In addition, a measure of device yield was designed to assess the consistency of the device performance derived from the specific conductive polymer ink. Device yield is the % of device numbers that showed reasonable device performance within the total number of duplicated device made within the experiment. In this regard, the term "reasonable device performance" is defined as following: current efficiency is greater than 3 Cd/A, lifetime is greater than 10 hrs and driving voltage is less than 10 Volts.

TABLE 1

Synthesis of PEDOT/s-PPO and PEDOT/s-PEEK conductive dispersions.

|  | PEDOT/s-PPO | | PEDOT/s-PEEK | |
| --- | --- | --- | --- | --- |
| EDOT/polymer ratio | 1:8 | 1:6 | 1:12 | 1:12 |
| Dispersion ID | A | B | C | D |
| % solid of polymer | 6.1% | | 4.9% | |
| EDOT | 0.25 g | 0.3 g | 0.175 g | 0.175 g |
| polymer | 32.5 g | 29 g | 43 g | 43 g |
| $H_2O$ | 32.5 g | 31 g | 23 g | 23 g |
| Ferric Sulfate | 1.4 g | 1.7 g | 1 g | 0.4 g |
| $H_2O$ | 10 g | 10 g | 10 g | 5 g |
| Sodium Persulfate |  | 0.4 g |  | 0.05 g |
| $H_2O$ |  | 5 g |  | 5 g |
| polymerization time (h) | 22 | 22 | 31 | 31 |
| IEX |  |  |  |  |
| IR-120/MP-62 | 14 g/14 g | 17 g/17 g | 10 g/10 g | 4 g/4 g |
| IEX time (h) | 5.5 | 5.5 | 15 | 15 |
| Resistivity (Ohm · cm) | 3.93E+4 | 2.33E+4 | 1.56E+4 | 2.2E+4 |

TABLE 2

Synthesis of PEDOT/s-PSU and PEDOT/s-PPPEK conductive dispersions.

|  | PEDOT/s-PSU | | PEDOT/s-PPPEK | |
| --- | --- | --- | --- | --- |
| EDOT/polymer ratio | 1:12 | 1:12 | 1:12 | 1:12 |
| Dispersion ID | E | F | G | H |
| % solid of polymer | 16.1% | | 6.5% | |
| EDOT | 0.175 g | 0.175 g | 0.175 g | 0.175 g |
| polymer | 13 g | 13 g | 32 g | 32 g |
| $H_2O$ | 53 g | 53 g | 34 g | 34 g |
| Ferric Sulfate | 1 g | 0.4 g | 1 g | 0.4 g |

TABLE 2-continued

Synthesis of PEDOT/s-PSU and PEDOT/s-PPPEK conductive dispersions.

| | PEDOT/s-PSU | | PEDOT/s-PPPEK | |
|---|---|---|---|---|
| $H_2O$ | 10 g | 5 g | 10 g | 5 g |
| Sodium Persulfate | | 0.05 g | | 0.05 g |
| $H_2O$ | | 5 g | | 5 g |
| polymerization time (h) | 18 | 18 | 31 | 31 |
| IEX | | | | |
| IR1-20/MP-62 | 10 g/10 g | 4 g/4 g | 10 g/10 g | 4 g/4 g |
| IEX time (h) | 4.5 | 4.5 | 15 | 15 |
| Resistivity (Ohm · cm) | 1.19E+08 | 3.69E+04 | 1.71E+04 | 4.38E+04 |

TABLE 3

Synthesis of PTT/s-PPPEK conductive dispersions.

| | PTT/s-PPPEK | |
|---|---|---|
| TT/polymer ratio | 1:10 | 1:10 |
| Dispersion ID | I | J |
| % solid of polymer | 5.7% | |
| TT | 0.2635 g | 0.2875 g |
| polymer | 46.5 g | 50.7 g |
| $H_2O$ | 40 g | 53 g |
| Ferric Sulfate | 1.14 | 1.63 |
| $H_2O$ | 10 | 10 |
| polymerization time (h) | 24 | 24 |
| IEX | | |
| IR-120/MP-62 | 20 g/20 g | 29 g/29 g |
| IEX time (h) | 15 | 15 |
| Resistivity (Ohm · cm) | 4.77E+06 | 3.05E+06 |

Example C

Conductive Polymer Ink

Conductive Polymer Dispersion D1 (poly(thieno[3,4-b]thiophene (PTT)/NAFION®-18:1)

1700 grams of deionized water was added to a 3 L jacketed reactor. 600 grams of a 12% NAFION® (EW 1100 supplied by the DuPont Company, Wilmington, Del.) dispersion in water was added to the reactor and mixed for 5 minutes with an overhead stirrer. The jacketed flask was adjusted to maintain a 22° C. reaction temperature. 4 grams (28.6 mmol) of thieno[3,4-b]thiophene (TT) was separately co-fed into the reactor with 17.7 grams (34.2 mmole) of $Fe_2(SO_4)_3$*$H_2O$ dissolved in 350 grams of deionized water. NAFION® to TT weight ratio of at charge was 18:1. The reaction mass turned from light green to emerald green to dark blue within 20 minutes. Polymerization was allowed to proceed for 4 hours after the introduction of monomer and oxidant. The resulting dispersion was then purified by adding the contents of the reactor to a 4 L Nalgene® bottle containing 94.0 grams of Amberlite® IR-120 cation exchange resin (Sigma-Aldrich Chemical Co) and 94.0 grams of Lewatit® MP-62 anion exchange resin (Fluka, Sigma-Aldrich Chemical Co), resulting in an opaque dark blue aqueous poly(thieno[3,4-b]thiophene)/NAFION® (PTT/NAFION® dispersion. The dispersion was filtered sequentially through 10, 5, 0.65 and 0.45 micron pore size filters. The dispersion was analyzed for residual metal ions by ICP-MS with the following ions being detected: Al (<1 ppm); Ba (<1 ppm); Ca (<20 ppm); Cr (<1 ppm), Fe (37 ppm); Mg (<1 ppm); Mn (<1 ppm); Ni (<1 ppm); Zn (<1 ppm); Na (<=6 ppm); K (<1 ppm). The final dispersion has a solid content of 2.86%, viscosity of 2.1 mPa·s and pH of 2.4.

Conductive Polymer Dispersion D2

PEDOT/Nafion 18:1

Conductive polymer dispersion D2 was made similarly as conductive polymer D1, except that 3,4-ethylenedioxythiophene (EDOT) was used instead of thieno[3,4-b]thiophene (TT). The final dispersion has a solid content of about 3% by weight, Nafion to PEDOT weight ratio at charge of 18:1.

Conductive Polymer Dispersion D3

PEDOT/s-PSU

Conductive polymer dispersion D3 was made similarly as dispersion F in example B as shown in Table 2, except that the s-PSU to PEDOT weight ratio charged in the reactor was 10:1 instead of 12:1.

Conductive Polymer Dispersion D4

PEDOT/s-PPEEK

Conductive polymer dispersion D4 was made similarly as dispersion G in example B as shown in Table 2.

Preparation of Cleaned Amberlite® IR120-Na Exchange Resin

A 500 mL polybottle was charged with 202 g of ion exchange resin, Amberlite® IR120 in the sodium form, and 300 mL of electronic grade water (Amberlite® is a federally registered trademark of Rohm & Haas Company, Philadelphia, Pa. for ion exchange resin). The material charge was allowed to soak without stirring at 20-24° C., for between one and four hours, after which the resin was collected on a 60 mesh stainless steel screen. This washing step was repeated for a total of five times at room temperature, followed by three more washes using same quantity of materials except the mixture was heated at 70° C. for 2 hours. The resin was finally collected on a 60 mesh screen to produce cleaned IR120-Na with 55.2% solids.

Preparation of Cleaned Amberlite® IR120-$NH_4$ Exchange Resin

A 500 mL polybottle was charged with 100 g of ion exchange resin, Amberlite® IR120 in the hydrogen form, 300 mL of electronic grade water, and 100 mL of concentrated (28-30%) ammonium hydroxide. The material charge was mixed for 16 hours on a jar roller at 20-24° C., after which the resin was collected on a 60 mesh stainless steel screen. The resin was then washed by soaking in 300 mL of electronic grade water without stirring for between one and four hours. This washing step was repeated for a total of five times at room temperature, followed by three more washes using same quantity of materials except the mixture was heated at 70° C. for 2 hours. The resin was finally collected on a 60 mesh screen to produce cleaned IR120-$NH_4$ with 56.9%% solids.

Conductive Polymer Ink I-C1

Invention

To prepare conductive polymer ink I-C1, conductive polymer dispersion D3 were mixed together with distilled water so that the final ink contained 2.55 wt % solid. The ink has a viscosity for 1.5 mPa·s, pH of 1.8 and a work function of 4.92 eV by Kelvin Probe where Nafion® polymer was used as the reference.

Conductive Polymer Ink I-C2

Invention

To prepare conductive polymer ink I-C2, 120 g of conductive polymer ink I-C1 were mixed with 12 g of cleaned IR120-Na® ion exchange resin in a polybottle. The bottle was placed on a roller overnight for about 16-17 hours after which the Ion Exchange Resin was removed by filtration through 0.45 um membrane filter under nitrogen pressure. The ink has a viscosity of 1.6 mPa·s, 2.8% of solid by weight, pH of 2.6 and a work function of 4.77 eV by Kelvin Probe where Nafion® polymer was used as the reference.

Conductive Polymer Ink I-C3

Invention

To prepare conductive polymer ink I-C3, 120 g of conductive polymer ink I-C1 were mixed with 12 g of cleaned IR120-NH$_4$ ion exchange resin in a polybottle. The bottle was placed on a roller overnight for about 16-17 hours after which the Ion Exchange Resin was removed by filtration through 0.45 um membrane filter under nitrogen pressure. The ink has a viscosity of 1.6 mPa·s, 2.85% of solid by weight, pH of 2.8 and a work function of 4.90 eV by Kelvin Probe during which Nafion® polymer was used as the reference.

Conductive Polymer Ink I-C4

Invention

To prepare conductive polymer ink I-C4, conductive polymer dispersion D4 were mixed together with distilled water so that the final ink contained 1.87 wt % solid. The ink has a viscosity for 2.7 mPa·s, pH of 1.6 and a work function of 5.15 eV by Kelvin during which Nafion® polymer was used as the reference.

Conductive Polymer Ink I-C5

Invention

To prepare conductive polymer ink I-C5, 120 g of conductive polymer ink I-C4 were mixed with 12 g of cleaned IR120-Na® ion exchange resin in a polybottle. The bottle was placed on a roller overnight for about 16-17 hours after which the Ion Exchange Resin was removed by filtration through 0.45 um membrane filter under nitrogen pressure. The ink has a viscosity of 3.0 mPa·s, 2.02% of solid by weight, pH of 2.5 and a work function of 5.02 eV by Kelvin Probe during which Nafion® polymer was used as the reference.

Conductive Polymer Ink I-C6

Invention

To prepare conductive polymer ink I-C6, 120 g of conductive polymer ink I-C4 were mixed with 12 g of cleaned IR120-NH$_4$® ion exchange resin in a polybottle. The bottle was placed on a roller overnight for about 16-17 hours after which the Ion Exchange Resin was removed by filtration through 0.45 um membrane filter under nitrogen pressure. The ink has a viscosity of 2.9 mPa·s, 2.03% of solid by weight, pH of 2.6 and a work function of 5.17 eV by Kelvin Probe during which Nafion® polymer was used as the reference.

Comparative Example

Conductive Polymer Ink C-C1

Conductive polymer ink C-C1 was the same as conductive polymer dispersion D2.

Comparative Example

Conductive Polymer Ink C-C2

Conductive polymer ink C-C2 was the same as conductive polymer dispersion D1.

Viscosity of the ink was measured using an ARES™ controlled-strain rheometer (TA Instruments, New Castle, Del., formerly Rheometric Scientific). Temperature was controlled at 25° C. using a circulating water bath. The atmosphere was saturated with water vapor to minimize water evaporation during testing. A Couette geometry was used; both bob and cup were constructed out of titanium. The bob was 32 mm in diameter and 33.3 mm in length; the diameter of the cup was 34 mm. Approximately 10 ml of sample was used per experiment. After sample loading, the sample was subjected to a 5 min preshear at 100 s-1 for removing the effects of loading history. After a 15 minute delay, viscosities were measured at shear rates ranging from 1 to 200 s$^{-1}$.

Film resistivity was measured using the ITO interdigitated electrodes on glass substrates as described in Example B. All the films were casted on a ITO glass substrate using a spin coating operation. The film resistively of the film before annealing and after annealing under 180° C. in nitrogen glove box for 15 mins were both collected. The ratio of the resistivity before annealing and after annealing is used as a way to evaluate the film resistivity stability. When the ratio is less than 30, it is indicated as "Good". When the ratio is larger than 30, it is indicated as "Poor".

In order to characterize the film wetting property, inks were deposited on substrates (e.g. 1"×1" ITO/Glass supplied by Colorado Concept Coatings LLC), by using a spin coating method. The specific spin speed was selected in order to achieve the film thickness between 50-100 nm. Kruss prop Shape Analysis System model DSA100 was used to obtain the contact angle of a liquid (such as water or organic solvent) drop onto the film under study. The equipment records the drop spreading over a specified time period (60 seconds). The drop shape analysis software calculates contact angle using a circle fitting method over this 60 second period. Film surface energy was determined by using the two component Flowkes theory model. Flowkes' theory assumes that the adhesive energy between a solid and a liquid can be separated into interactions between the dispersive components of the two phases and interactions between the non-dispersive (polar) components of the two phases. The dispersive component of the surface energy $\sigma_s^D$ was determined by measuring the film contact angle with a liquid which has only a dispersive component, such Diiodomethane ($\sigma_L = \sigma_L^D = 50.8$ mN/m). Afterwards, the film contact angle with the second liquid which has both a dispersive component and a non-dispersive (polar) component e.g. water ($\sigma_L^P = 46.4$ mN/m, $\sigma_L^D = 26.4$ mN/m)

was tested. One can calculate $\sigma_S^P$ by the following equation: $(\sigma_L^D)^{1/2}(\sigma_S^D)^{1/2}+(\sigma_L^P)^{1/2}(\sigma_S^P)^{1/2}=\sigma_L(\cos\theta+1)/2$.

In the OLED device structure as described in FIG. 1, an electroluminescent (EL) layer could be deposited on top of the hole injection layer (HIL) by a solution method. In order to enhance device performance and film formation, it is desirable to have wetting of the EL material on the HIL film substrate. Wetting is defined as the contact between a fluid and a surface. When a liquid has a high surface tension (strong internal bonds), it tends to form a droplet on the surface. Whereas a liquid with low surface tension tends to spread out over a greater area (bonding to the surface). On the other hand, if a solid surface has high surface energy (or surface tension), a drop will spread, or wet, the surface. If the solid surface has low surface energy, a droplet will form. This phenomenon is typically a result of the minimization of interfacial energy. The primary measurement to determine wettability is a contact angle measurement. This measures the angle between the surfaces of a liquid droplet on the solid surface. In order for wetting to take place, the surface tension of the depositing liquid must be lower than that of the surface that it is contacting. Therefore, it is useful to measure the solid surface energy of the HIL film. Since most of the EL materials used in OLED devices use organic solvents such as xylene, or toluene as a carrying liquid, which has a liquid surface tension in the range of 18 to 30 mN/m, it is desirable that the HIL film solid surface has a surface energy of larger than 30 mN/m in order to achieve good wetting. Therefore, when a film has a solid surface energy greater than 30 mN/m, such is characterized as a "wetting friendly film". Similarly, when a film has a solid surface energy less than 30 mN/m, it is characterized as "Non wetting friendly film". This criteria was used in Table 4.

TABLE 4

Conductive polymer ink film resistivity properties for Example C

| Conductive Polymer Inks | Film Thickness (nm) | Resistivity (ohm cm) As is | Resistivity (ohm cm) 180° C. Annealing | Ratio (annealed/ As is) | Resistivity Stability Control |
|---|---|---|---|---|---|
| I-C1 | 72 | 9.14E4 | 3.77E4 | 2.4 | Good |
| I-C2 | 65 | 5.51E4 | 3.96E4 | 1.4 | Good |
| I-C3 | 63 | 5.93E4 | 2.45E4 | 2.4 | Good |
| I-C4 | 71 | 3.51E5 | 1.92E5 | 1.8 | Good |
| I-C5 | 58 | 4.34E5 | 3.46E5 | 1.3 | Good |
| 8I-C6 | 54 | 5.52E5 | 1.90E5 | 2.9 | Good |
| C-C1 | 40 | 2.98E+05 | 5.83E+02 | 511 | Poor |
| C-C2 | 47 | 6.49E+01 | 1.72E+00 | 37.7 | Poor |

TABLE 5

Conductive polymer ink film surface energy for Example C

| Conductive Polymer Inks | Contact angle with Toulene | $\sigma_s^D$ (mN/m) Dispersive component | $\sigma_s^P$ (mN/m) Polar component | $\sigma_s$ (mN/m) Overall Film | Wetting Friendly Film |
|---|---|---|---|---|---|
| I-C1 | 2.6 | 44.9 | 8.3 | 53.2 | Yes |
| I-C4 | 2.5 | 45.4 | 9.4 | 54.8 | Yes |
| C-C1 | 44.5 | 22.4 | 2.1 | 24.5 | No |

TABLE 6

Conductive blue polymer device performance for Example C

| Conductive Polymer Inks | Driving Voltage at 3000 nits (Volts) | Current Efficiency (Cd/A) | Lifetime (hrs) | Voltage increase during LT % | Device yield |
|---|---|---|---|---|---|
| I-C1 | 5.9-6.1 | 7.2-9.0 | 114-202 | 11-16 | 100% |
| I-C2 | 6.1-6.2 | 7.7-8.9 | 65-91 | 15-18 | 100% |
| I-C3 | 5.7-6.0 | 7.0-7.2 | 65-109 | 11-12 | 100% |
| I-C4 | 6.7-7.2 | 8.1-8.2 | 253-269 | 4-10 | 100% |
| I-C5 | 6.7-6.9 | 7.6-8.2 | 85-98 | 8-14 | 100% |
| I-C6 | 6.3-6.6 | 6.9-7.5 | 121-146 | 5-9 | 100% |
| C-C1 | 5.5-17.5 | 1.2-11.0 | 0-268 | >19 | 33% |

The data in Table 4 demonstrates that the conductive polymer inks comprising ether containing polymers in this invention showed significantly improved resistivity stability over a wide range of annealing temperature as compared to conductive polymer dispersion ink (C-C1 and C-C2) which does not contain the ether-containing polymeric acid. In addition, the data in Table 4 demonstrated that the conductive polymer inks comprising ether containing polymers in this invention formed solid film having a higher surface energy as compared with the control ink (C-C1). This unique property allows increased wetting of the EL solution when they are deposited on the inventive film as part of the EL device fabrication. Furthermore, the data in Table 6 demonstrated that the conductive polymer inks comprising ether containing polymers in this invention can be used to make functional devices with better performance consistency from device to device as compared to the control ink (C-C1).

Example D

Conductive Polymer Ink

Conductive Polymer Dispersion D5

PEDOT/s-PPEEK

Conductive polymer dispersion D5 was made similarly as dispersion D4 in example C, except that the weight ratio of PPEEK to PEDOT at charge is 10:1 instead of 12:1.

Conductive Polymer Ink I-D1

Invention

Conductive polymer ink I-D1 is the same as conductive polymer dispersion D5. The ink was analyzed for residual metal ions by ICP-MS with the following ions being detected: Al (<1 ppm); Ba (<1 ppm); Ca (<2 ppm); Cr (<0.1 ppm), Fe (9 ppm); Mg (<0.1 ppm); Mn (<0.1 ppm); Ni (<0.1 ppm); Zn (<0.6 ppm); Na (3 ppm); K (8 ppm). pH of the ink was measured to 1.5 and work function of 5.20 eV by Kelvin Probe using 6.10 eV as Nafion's work function.

Conductive Polymer Ink I-D2

Invention

To prepare conductive polymer ink I-D2, 15 g of conductive polymer dispersion D5 were put in a polybottle and 1N NaOH was added drop-wise while under stirring. Total amount of 0.67 g of 1N NaOH was added leading to a base loading of about 4.47 wt % per dispersion weight. The final ink has a pH of 2.66 and work function of 4.92 eV by Kelvin Probe using 6.10 eV as Nafion's work function. The ink was analyzed for residual metal ions by ICP-MS with the following ions being detected Al (<1 ppm); Ba (<1 ppm); Ca (<2 ppm); Cr (<0.1 ppm), Fe (7 ppm); Mg (<0.5 ppm); Mn (<0.1 ppm); Ni (<0.1 ppm); Zn (<0.6 ppm); Na (963 ppm); K (14 ppm).

Conductive Polymer Ink I-D3

Invention

To prepare conductive polymer ink I-D3, 15.7 g of conductive polymer dispersion D5 were put in a polybottle and 1N NaOH was added drop-wise while under stirring. Total amount of 0.82 g of 1N NaOH was added leading to a base loading of about 5.22 wt % per dispersion weight. The final ink has a pH of 4.88 and work function of 4.72 eV by Kelvin Probe using 6.10 eV as Nafion's work function. The ink was analyzed for residual metal ions by ICP-MS with the following ions being detected Al (<1 ppm); Ba (<1 ppm); Ca (<2 ppm); Cr (<0.1 ppm), Fe (7 ppm); Mg (<0.5 ppm); Mn (<0.1 ppm); Ni (<0.1 ppm); Zn (<0.6 ppm); Na (1183 ppm); K (19 ppm).

Conductive Polymer Ink I-D4

Invention

To prepare conductive polymer ink I-D4, 17.1 g of conductive polymer dispersion D5 were put in a polybottle and 1N NaOH was added drop-wise while under stirring. Total amount of 0.90 g of 1N NaOH was added leading to a base loading of about 5.26 wt % per dispersion weight. The final ink has a pH of 6.25 and work function of 4.69 eV by Kelvin Probe using 6.10 eV as Nafion's work function. The ink was analyzed for residual metal ions by ICP-MS with the following ions being detected Al (<1 ppm); Ba (<1 ppm); Ca (<2 ppm); Cr (<0.1 ppm), Fe (7 ppm); Mg (<0.5 ppm); Mn (<0.1 ppm); Ni (<0.1 ppm); Zn (<0.6 ppm); Na (1258 ppm); K (24 ppm).

Film resistivity was measured using the ITO interdigitated electrodes on glass substrates as described in Example B and C. All the films were casted on a ITO glass substrate using a spin coating operation. Before annealing, the film resistivity was measured using the interdigited electrodes setup as described in Example B. The film was then annealed under 130° C. for 15 mins in nitrogen glove box and cooled down to room temperature to collect the resistivity data. Then the same substrate was put on the hot plate for the second annealing under 180° C. in nitrogen glove box for 15 mins. The film resistivity data was then collected. The ratio of the resistivity before annealing and after annealing is used as a way to evaluate the film resistivity stability. When the ratio is less than 30, it is indicated as "Good". When the ration is larger than 30, it is indicated as "Poor".

The data in Table 7 demonstrates that the conductive polymer inks comprising ether containing polymers in this invention showed improved resistivity stability over a wide range of annealing temperature as compared to conductive polymer dispersion ink (C-C1 and C-C2) which does not contain the ether-containing polymeric acid. It also indicated that further modification of material properties of the inventive ether containing dispersions was possible by post-polymerization treatment such as counter-ion type and pH level adjustment as shown in Example D, Table 7.

While the invention has been described with reference to certain aspects or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular aspects or embodiments disclosed herein, but that the invention will include all aspects and embodiments falling within the scope of the appended claims.

The invention claimed is:

1. An aqueous dispersion comprising water, at least one polymeric acid doped conductive polymer, and at least one ether containing polymer; wherein the polymeric acid doped conductive polymer comprises at least one member selected from the group consisting of polyanilines, polythiophenes, polypyrroles, polyacetylenes, polythienothiophene/polystyrenesulfonic acid, polydioxythiophene/polystyrenesulfonic acid, polyaniline-polymeric-acid-colloids, poly(3,4-ethylenedioxythiophene) (PEDOT), PEDOT-polymeric-acid-colloids, selenium containing polymers and mixtures thereof, and the ether containing polymer comprises at least one member selected from the group consisting of sulfonated poly (ether ketone), sulfonated poly(arylene oxide), sulfonated polysulfone, sulfonated polyether ether ketone (PEEK), sulfonated poly(hydroxyphenylphthalazinone ether ketone) sulfonated poly(phenylene oxide), sulfonated polysulfone, sulfonated fluorinated polysulfone and mixtures thereof.

2. The dispersion of claim 1, wherein the polymeric acid doped conductive polymer comprises poly(thieno[3,4-b] thiophene).

3. The dispersion of claim 1, wherein the dispersion comprises a colloid-forming polymeric acid that comprises at least one fluorinated sulfonic acid polymer.

4. The dispersion of claim 1, wherein the dispersion is treated with basic ion exchange resin.

5. The dispersion of claim 1, wherein the dispersion is treated with at least one basic compound.

TABLE 7

Conductive polymer ink film resistivity properties for Example D

| Conductive Polymer Inks | Film Thickness (nm) | Resistivity (ohm cm) As is | Resistivity (ohm cm) 130° C. Annealing | Resistivity (ohm cm) 180° C. Annealing | Ratio (As is/180° C. (130° C./180° C.) | Resistivity Stability Control |
|---|---|---|---|---|---|---|
| I-D1 | 92 | 5.94E+05 | 4.43E+05 | 3.09E+05 | 1.9 & 1.4 | Good |
| I-D2 | 99 | 8.27E+05 | 7.59E+05 | 6.93E+05 | 1.2 & 1.1 | Good |
| I-D3 | 91 | 9.91E+05 | 1.02E+06 | 1.14E+06 | 0.9 & 0.9 | Good |
| I-D4 | 94 | 1.01E+06 | 1.07E+06 | 1.22E+06 | 0.8 & 0.9 | Good |
| C-C1 | 40 | 2.98E+05 | | 5.83E+02 | 511 | Poor |
| C-C2 | 47 | 6.49E+01 | | 1.72E+00 | 37.7 | Poor |

6. The dispersion of claim 5, wherein the basic compound comprises at least one member selected from the group consisting of sodium hydroxide, ammonium hydroxide, tetramethylammonium hydroxide, calcium hydroxide, cesium hydroxide, and combinations thereof.

7. The dispersion of claim 1, wherein the polymeric acid doped conductive polymer comprises at least one member selected from the group consisting of polythienothiophene/polystyrenesulfonic acid and PEDOT-polymeric-acid-colloids.

8. The dispersion of claim 1 wherein the ether containing polymer comprises at least one member selected from the group consisting of sulfonated poly(ether ketone), sulfonated poly(arylene oxide), sulfonated polysulfone, and mixtures thereof.

9. The dispersion of claim 1 wherein the ether containing polymer comprises at least one member selected from the group consisting of sulfonated PEEK, sulfonated poly(hydroxyphenylphthalazinone ether ketone) sulfonated poly(phenylene oxide), sulfonated polysulfone, sulfonated fluorinated polysulfone and mixtures thereof.

10. The dispersion of claim 1 further comprising at least one sulfate.

11. The dispersion of claim 1 further comprising at least one colloid-forming polymeric acid and at least one non-fluorinated polymer acid.

12. A dispersion comprising water, at least one polymeric acid doped conductive polymer, and at least one ether containing polymer; wherein the conductive polymer comprises at least one polythiophene or polythienothiophene, and the ether containing polymer comprises at least one member selected from the group consisting of sulfonated poly(ether ketone), sulfonated PEEK, sulfonated poly(hydroxyphenylphthalazinone ether ketone), and mixtures thereof.

13. The dispersion of claim 12 wherein the polymeric acid doped conductive polymer comprises at least one polythienothiophene.

14. The dispersion of claim 12 wherein the ether containing polymer comprises sulfonated PEEK.

15. The dispersion of claim 12 wherein the ether containing polymer comprises sulfonated poly(ether ketone).

16. The dispersion of claim 12 wherein the ether containing polymer comprises sulfonated poly(hydroxyphenylphthalazinone ether ketone) sulfonated poly(phenylene oxide).

17. An aqueous dispersion comprising water, at least one polymeric acid doped conductive polymer, and at least one ether containing polymer; wherein the polymeric acid doped conductive polymer was polymerized in the presence of the ether containing polymer and the ether containing polymer comprises at least one member selected from the group consisting of sulfonated poly(ether ketone), sulfonated poly(arylene oxide), sulfonated polysulfone, sulfonated polyether ether ketone, sulfonated poly(hydroxyphenylphthalazinone ether ketone) sulfonated poly(phenylene oxide), sulfonated polysulfone, sulfonated fluorinated polysulfone and mixtures thereof.

18. The dispersion of claim 17 further comprising at least one member selected from the group consisting of ethylene glycol, propylene glycol, propylene glycol propyl ether and methyl ether ketone.

* * * * *